United States Patent
Abou-Khalil et al.

(10) Patent No.: US 9,245,960 B2
(45) Date of Patent: Jan. 26, 2016

(54) LATERAL EXTENDED DRAIN METAL OXIDE SEMICONDUCTOR FIELD EFFECT TRANSISTOR (LEDMOSFET) WITH TAPERED AIRGAP FIELD PLATES

(71) Applicant: International Business Machines Corporation, Armonk, NY (US)

(72) Inventors: Michel J. Abou-Khalil, Essex Junction, VT (US); Theodore J. Letavic, Putnam Valley, NY (US); Stephen E. Luce, Underhill, VT (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/762,450

(22) Filed: Feb. 8, 2013

(65) Prior Publication Data
US 2014/0225186 A1   Aug. 14, 2014

(51) Int. Cl.
*H01L 29/40* (2006.01)
*H01L 29/66* (2006.01)
*H01L 29/78* (2006.01)

(52) U.S. Cl.
CPC ........ *H01L 29/407* (2013.01); *H01L 29/66704* (2013.01); *H01L 29/66712* (2013.01); *H01L 29/66795* (2013.01); *H01L 29/785* (2013.01);
(Continued)

(58) Field of Classification Search
CPC .. H01L 29/402; H01L 29/404; H01L 29/7835
USPC .................. 257/60, 330, 342, 409; 438/270
See application file for complete search history.

(56) References Cited

U.S. PATENT DOCUMENTS

| 5,907,177 A | 5/1999 | Uda et al. |
| 5,907,181 A | 5/1999 | Han et al. |
| 6,023,090 A | 2/2000 | Letavic et al. |

(Continued)

FOREIGN PATENT DOCUMENTS

WO    2009050669 A2    4/2009

OTHER PUBLICATIONS

U.S. Appl. No. 13/238,414, BUR920110056US1, Office Action Communication dated Apr. 29, 2014, 10 pages.
(Continued)

*Primary Examiner* — Jerome Jackson, Jr.
*Assistant Examiner* — Fang-Xing Jiang
(74) *Attorney, Agent, or Firm* — Gibb & Riley, LLC; Michael J. LeStrange, Esq.

(57) ABSTRACT

Disclosed are embodiments of a lateral, extended drain, metal oxide semiconductor, field effect transistor (LEDMOSFET) having tapered dielectric field plates positioned laterally between conductive field plates and opposing sides of a drain drift region of the LEDMOSFET. Each dielectric field plate comprises, in whole or in part, an airgap. These field plates form plate capacitors that can create an essentially uniform horizontal electric field profile within the drain drift region so that the LEDMOSFET can exhibit a specific, relatively high, breakdown voltage (Vb). Tapered dielectric field plates that incorporate airgaps provide for better control over the creation of the uniform horizontal electric field profile within the drain drift region, as compared to tapered dielectric field plates without such airgaps and, thereby ensure that the LEDMOSFET exhibits the specific, relatively high, Vb desired. Also disclosed herein are embodiments of a method of forming such an LEDMOSFET.

24 Claims, 21 Drawing Sheets

(52) U.S. Cl.
CPC ........ *H01L 29/7824* (2013.01); *H01L 29/7825* (2013.01)

(56) References Cited

U.S. PATENT DOCUMENTS

| | | | |
|---|---|---|---|
| 6,046,474 | A | 4/2000 | Oh et al. |
| 6,414,365 | B1 | 7/2002 | Letavic et al. |
| 6,515,336 | B1 | 2/2003 | Suzawa et al. |
| 6,534,367 | B2 | 3/2003 | Farr et al. |
| 6,617,656 | B2 | 9/2003 | Lee et al. |
| 6,646,287 | B1 | 11/2003 | Ono et al. |
| 6,717,214 | B2 | 4/2004 | Pettruzello et al. |
| 6,833,726 | B2 | 12/2004 | Petruzzello et al. |
| 7,531,875 | B2 | 5/2009 | Udrea et al. |
| 7,663,237 | B2 | 2/2010 | Peng et al. |
| 7,736,956 | B2 | 6/2010 | Datta et al. |
| 7,777,278 | B2 | 8/2010 | Hirler et al. |
| 7,808,050 | B2 | 10/2010 | Sonsky et al. |
| 7,888,732 | B2 | 2/2011 | Denison et al. |
| 7,897,478 | B2 | 3/2011 | Sonsky |
| 8,299,547 | B2 * | 10/2012 | Abou-Khalil et al. ........ 257/409 |
| 2001/0000033 | A1 * | 3/2001 | Baliga ........................... 438/270 |
| 2004/0232486 | A1 * | 11/2004 | Disney et al. ................. 257/342 |
| 2005/0082591 | A1 | 4/2005 | Hirler et al. |
| 2006/0006386 | A1 * | 1/2006 | Hirler et al. ..................... 257/60 |
| 2007/0052060 | A1 | 3/2007 | Yang |
| 2007/0120187 | A1 | 5/2007 | Udrea et al. |
| 2008/0128743 | A1 | 6/2008 | Letavic et al. |
| 2008/0179672 | A1 | 7/2008 | Hirler et al. |
| 2008/0272428 | A1 * | 11/2008 | Letavic et al. ................. 257/330 |
| 2009/0072319 | A1 | 3/2009 | Sonsky et al. |
| 2009/0256212 | A1 | 10/2009 | Denison et al. |
| 2010/0213517 | A1 | 8/2010 | Sonsky et al. |
| 2011/0127602 | A1 | 6/2011 | Mallikarjunaswamy |
| 2011/0147844 | A1 | 6/2011 | Smith |
| 2011/0169103 | A1 | 7/2011 | Darwish et al. |
| 2011/0198691 | A1 | 8/2011 | Sonsky et al. |
| 2012/0168766 | A1 * | 7/2012 | Abou-Khalil ......... H01L 29/402 257/76 |
| 2012/0168817 | A1 * | 7/2012 | Abou-Khalil ......... H01L 29/402 257/133 |

OTHER PUBLICATIONS

Abou-Khalil, et al., U.S. Appl. No. 13/604,671, filed Sep. 6, 2012.
Heringa et al., "Innovative lateral field plates by gate fingers on STI regions in deep submicron CMOS," Proceedings of the 20th International Symposium on Power Semiconductor Devices & IC's IEEE, May 2008, pp. 271-274.
U.S. Appl. No. 13/604,671, Notice of Allowance dated Feb. 26, 2013, 17 pages.
U.S. Appl. No. 13/238,414, Office Action Communication dated Jan. 30, 2014, 7 pages.
U.S. Appl. No. 13/238,414, Notice of Allowance dated Jul. 21, 2014, 4 pages.

* cited by examiner 100 (A-A'), 200 (A-A') or 300 (A-A')

170, 270, 370

104, 204, 304
105, 205, 305
102, 202, 302
101, 201, 301

193, 110, 120, 130, 195, 140, 150, 194,
293, 210, 220, 230, 295, 240, 250, 294,
393  310  320  330  395  340  350  394

100 (B-B'), 200 (B-B'), or 300 (B-B')

170, 270, 370
104, 204, 304
105, 205, 305
102, 202, 302
101, 201, 301

195
191, 295, 130, 192,
291, 395  230, 292,
391       330  392

LATERAL EXTENDED DRAIN METAL OXIDE SEMICONDUCTOR FIELD EFFECT TRANSISTOR (LEDMOSFET) WITH TAPERED AIRGAP FIELD PLATES

BACKGROUND

1. Field of the Invention

The embodiments disclosed herein relate to lateral, extended drain, metal oxide semiconductor, field effect transistors (LEDMOSFETs) and, more specifically, to an LEDMOSFET having tapered airgap field plates to achieve a relatively high drain-to-body breakdown voltage and a method of forming the LEDMOSFET.

2. Description of the Related Art

Generally, integrated circuit structures are designed with the following goals in mind: (1) decreasing device size; (2) increasing device performance (e.g., by increasing switching speed) and (3) decreasing power consumption. Device size scaling can lead to a corresponding decrease in device channel lengths and, thereby a corresponding increase in switching speed. However, device size scaling has its limits because short channel lengths can also lead to a number of undesirable "short-channel effects". These short-channel effects include, but are not limited to, a reduction in threshold voltage (Vt), an increase in drain leakage current, punch through (i.e., diffusion of dopants from the source and drain into the channel), and drain induced barrier lowering (DIBL).

To overcome or at least reduce such short-channel effects, halos can be incorporated into field effect transistor structures. Specifically, halos are highly doped regions, which have the same conductivity type as the field effect transistor body and which are positioned on each side of the channel (i.e., on the source-side and the drain-side of the channel) at the interfaces with the source and drain, respectively. These halos reduce the presence of short channel effects (e.g., increase threshold voltage (Vt), reduce punch through, etc.) and the effectiveness of the halos is dependent upon the location, concentration, and confinement of the halo dopant. Unfortunately, halos with a relatively high dopant concentration can also cause a corresponding decrease in switching speed.

Consequently, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Those skilled in the art will recognize that the source/drain drift regions are also often referred to source/drain extension regions. Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to gate capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

SUMMARY

In view of the foregoing, disclosed herein are embodiments of a lateral, extended drain, metal oxide semiconductor, field effect transistor (LEDMOSFET) having tapered dielectric field plates positioned laterally between conductive field plates and opposing sides of a drain drift region of the LEDMOSFET. Each tapered dielectric field plate comprises, in whole or in part, a cavity filled with air or gas (i.e., an airgap or void). The conductive and dielectric field plates, as described above, form plate capacitors that can create an essentially uniform horizontal electric field profile within the drain drift region so that the LEDMOSFET can exhibit a specific, relatively high, breakdown voltage (Vb). Tapered dielectric field plates that incorporate airgaps provide for better control over the creation of the uniform horizontal electric field profile within the drain drift region, as compared to tapered dielectric field plates without such airgaps and, thereby ensure that the LEDMOSFET exhibits the specific, relatively high, breakdown voltage (Vb) desired. Also disclosed herein are embodiments of a method of forming such an LEDMOSFET.

More particularly, disclosed herein are embodiments of a lateral, extended drain, metal oxide semiconductor, field effect transistor (LEDMOSFET). Each of these LEDMOSFET embodiments can comprise a semiconductor body having opposing sidewalls, a first end and a second end opposite the first end. The semiconductor body can comprise a source region at the first end, a drain region at the second end, a channel region adjacent to the source region, and a drain drift region between the channel region and the drain region.

Additionally, each of these LEDMOSFET embodiments can comprise tapered dielectric field plates and conductive field plates. The tapered dielectric field plates can be positioned adjacent to the opposing sidewalls of the semiconductor body at the drain drift region and the conductive field plates can be positioned adjacent to the tapered dielectric field plates such that each tapered dielectric field plate is positioned laterally between the drain drift region and a conductive field plate. The tapered dielectric field plates can each incorporate a cavity filled with air or gas (i.e., an airgap or void), in whole or in part. Such dielectric and conductive field plates form plate capacitors that can create an essentially uniform horizontal electric field profile within the drain drift region of the semiconductor body and, thereby ensure that the LEDMOSFET exhibits a desired specific, relatively high, breakdown voltage (Vb).

Specifically, in one embodiment of the LEDMOSFET, each tapered dielectric field plate can be positioned laterally between the drain drift region and a conductive field plate, can have a width that increases along the length of the drain drift region from the channel region to the drain region, and can comprise a portion of an isolation region between the semiconductor body and the conductive field plate and, contained within that portion of the isolation region, a cavity filled with air or gas (i.e., an airgap or void). The cavity can be defined by vertical surfaces (i.e., sidewalls) of a trench patterned within the portion of the isolation region and can be capped by a dielectric cap layer.

In another embodiment of the LEDMOSFET, each tapered dielectric field plate can be positioned laterally between the drain drift region and a conductive field plate, can have a width that increases along the length of the drain drift region from the channel region to the drain region, and can comprise, in its entirety, a cavity filled with air or gas (i.e., an airgap or void). This cavity can comprise a trench defined by vertical surfaces (i.e., sidewalls) of the semiconductor body at the drain drift region, of the conductive field plate and of an isolation region positioned laterally around the semiconductor body. This cavity (i.e., the entire trench in this case) can further extend vertically at least to an isolation layer below and can be capped by a dielectric cap layer.

In yet another embodiment of the LEDMOSFET, each tapered dielectric field plate can be positioned laterally between the drain drift region and a conductive field plate, can have a width that increases along the length of the drain drift region from the channel region to the drain region, and can comprise a cavity that is filled with air or gas (i.e., an airgap or void) and that is contained within a trench, which is lined with a dielectric liner. Specifically, this trench can be defined by vertical surfaces (i.e., sidewalls) of the semiconductor body at the drain drift region, of the conductive field plate and of an isolation region positioned laterally around the semiconductor body. This trench can further extend vertically at least to an isolation layer below, can be lined by a dielectric liner and can be capped by a dielectric cap layer such that the cavity, which is filled with air or gas, is contained therein.

Also disclosed herein are embodiments of a method of forming a lateral, extended drain, metal oxide semiconductor, field effect transistor (LEDMOSFET). These method embodiments can comprise forming a semiconductor body having opposing sidewalls, a first end and a second end opposite the first end. This semiconductor body can further have the following regions: a source region at the first end, a drain region at the second end, a channel region adjacent to the source region, and a drain drift region between the channel region and the drain region. Additionally, these method embodiments can comprise forming tapered dielectric field plates comprising, in whole or in part, cavities filled with air (i.e., airgaps or voids), adjacent to the opposing sidewalls of the semiconductor body at the drain drift region and conductive field plates adjacent to the tapered dielectric field plates.

Specifically, the process of forming the tapered dielectric field plates and conductive field plates can be performed such that each tapered dielectric field plate is positioned laterally between the drain drift region and a conductive field plate and such that each tapered dielectric field plate has a width that increases along the length of the drain drift region from the channel region to the drain region. Furthermore, in these method embodiments, the tapered dielectric field plates can be formed so that each tapered dielectric field plate incorporates a cavity filled with air or gas (i.e., an airgap or void), in whole or in part. Such dielectric and conductive field plates form plate capacitors that can create an essentially uniform horizontal electric field profile within the drain drift region of the semiconductor body and, thereby ensure that the LEDMOSFET exhibits a desired specific, relatively high, breakdown voltage (Vb).

More specifically, in one embodiment of the method, the tapered dielectric field plates and conductive field plates can be formed such that each tapered dielectric field plate is positioned laterally between the drain drift region and a conductive field plate, has a width that increases along the length of the drain drift region from the channel region to the drain region, and comprises an essentially triangular shaped portion of an isolation region between the semiconductor body and the conductive field plate and, contained within that portion of the isolation region, a cavity filled with air or gas (i.e., an airgap or void). In this case, air or gas-filled cavities can be formed by forming essentially triangular shaped trenches within the portions of the isolation region, which are between the conductive field plates and the drain drift region. During subsequent processing, these trenches can be filled with a degradable sacrificial material and can be capped by a dielectric cap layer. Then, the degradable sacrificial material contained within the trenches can be degraded, thereby forming the desired cavities.

In another embodiment of the method, the tapered dielectric field plates and conductive field plates can be formed such that each tapered dielectric field plate is positioned laterally between the drain drift region and a conductive field plate, has a width that increases along the length of the drain drift region from the channel region to the drain region, and comprises, in its entirety, a cavity filled with air or gas (i.e., an airgap or void). In this case, air or gas-filled cavities can be formed by forming essentially triangular shaped trenches, each defined by vertical surfaces (i.e., sidewalls) of the semiconductor body at the drain drift region, of the conductive field plate and of an isolation region positioned laterally around the semiconductor body. These trenches can further be formed so that they extend vertically to at least an isolation layer below. During subsequent processing, these trenches can be filled with a degradable sacrificial material and can be capped by a dielectric cap layer. Then, the degradable sacrificial material contained within the trenches can be degraded, thereby forming the desired cavities.

In yet another embodiment of the method, the tapered dielectric field plates and conductive field plates can be formed such that each tapered dielectric field plate is positioned laterally between the drain drift region and a conductive field plate, has a width that increases along the length of the drain drift region from the channel region to the drain region, and comprises a cavity that is filled with air or gas (i.e., an airgap or void) and that is contained within a trench, which is lined with a dielectric liner. In this case, air or gas-filled cavities can be formed by forming essentially triangular shaped trenches, each defined by vertical surfaces (i.e., sidewalls) of the semiconductor body at the drain drift region, of the conductive field plate and of an isolation region positioned laterally around the semiconductor body. These trenches can further be formed so that they extend vertically to at least an isolation layer below. During subsequent processing, these trenches can be lined with a dielectric liner, can be filled with a degradable sacrificial material and can be capped by a dielectric cap layer. Then, the degradable sacrificial material contained within the trenches can be degraded, thereby forming the desired cavities.

BRIEF DESCRIPTION OF THE SEVERAL
VIEWS OF THE DRAWINGS

The embodiments disclosed herein will be better understood from the following detailed description with reference to the drawings, which are not necessarily drawn to scale and in which.

DETAILED DESCRIPTION

Figure 1:
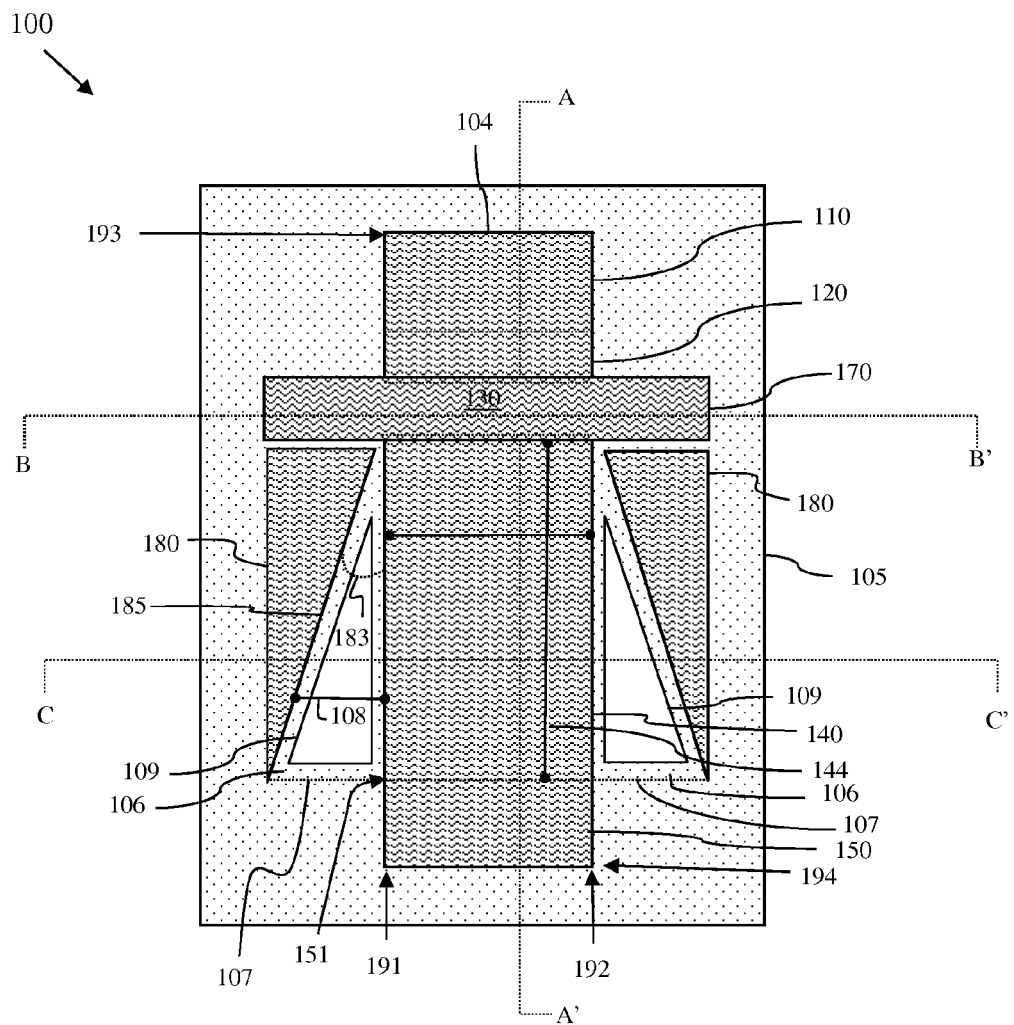
FIG. 1 is a top view diagram illustrating an embodiment of a lateral, extended drain, metal oxide semiconductor, field effect transistor (LEDMOSFET)

As mentioned above, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

Recently, embodiments of a lateral, extended drain, metal oxide semiconductor, field effect transistor (LEDMOSFET) with a relatively high drain-to-body breakdown voltage (Vb) have been developed (e.g., see U.S. Patent Application Publication No. 20120168766 of Abou-Khalil et al., published on Jul. 5, 2012 and U.S. Patent Application Publication No. 20120168817 of Abou-Khalil et al., also published on Jul. 5, 2012, both of which are assigned to International Business Machines Corporation and incorporated herein by reference). In these LEDMOSFET embodiments, tapered dielectric field plates are positioned laterally between conductive field plates and opposing sides of a drain drift region in a semiconductor body. The tapered dielectric field plates specifically comprise essentially triangular portions of an isolation region, which defines the semiconductor body and comprises one or more conventional trench isolation materials (e.g., a silicon dioxide ($SiO_2$), silicon nitride (SiN), silicon oxynitride (SiON), etc.). The conductive and dielectric field plates, as described above, form plate capacitors that can create an essentially uniform horizontal electric field profile within the drain drift region so that the LEDMOSFET can exhibit a specific, relatively high, breakdown voltage (Vb). While the tapered dielectric field plates in these LEDMOSFET embodiments are suitable for the purposes for which they were designed, it would be advantageous to improve upon their structure in order to better control the creation of the uniform horizontal electric field profile within the drain drift region and, thereby to better ensure that the LEDMOSFET exhibits the specific, relatively high, breakdown voltage (Vb) desired.

In view of the foregoing, disclosed herein are embodiments of a lateral, extended drain, metal oxide semiconductor, field effect transistor (LEDMOSFET) having tapered dielectric field plates positioned laterally between conductive field plates and opposing sides of a drain drift region of the LEDMOSFET. Each tapered dielectric field plate comprises, in whole or in part, a cavity filled with air or gas (i.e., an airgap or void). The conductive and dielectric field plates, as described above, form plate capacitors that can create an essentially uniform horizontal electric field profile within the drain drift region so that the LEDMOSFET can exhibit a specific, relatively high, breakdown voltage (Vb). Tapered dielectric field plates that incorporate airgaps provide for better control over the creation of the uniform horizontal electric field profile within the drain drift region, as compared to tapered dielectric field plates without such airgaps and, thereby ensure that the LEDMOSFET exhibits the specific, relatively high, breakdown voltage (Vb) desired. Also disclosed herein are embodiments of a method of forming such an LEDMOSFET.

Figure 2:
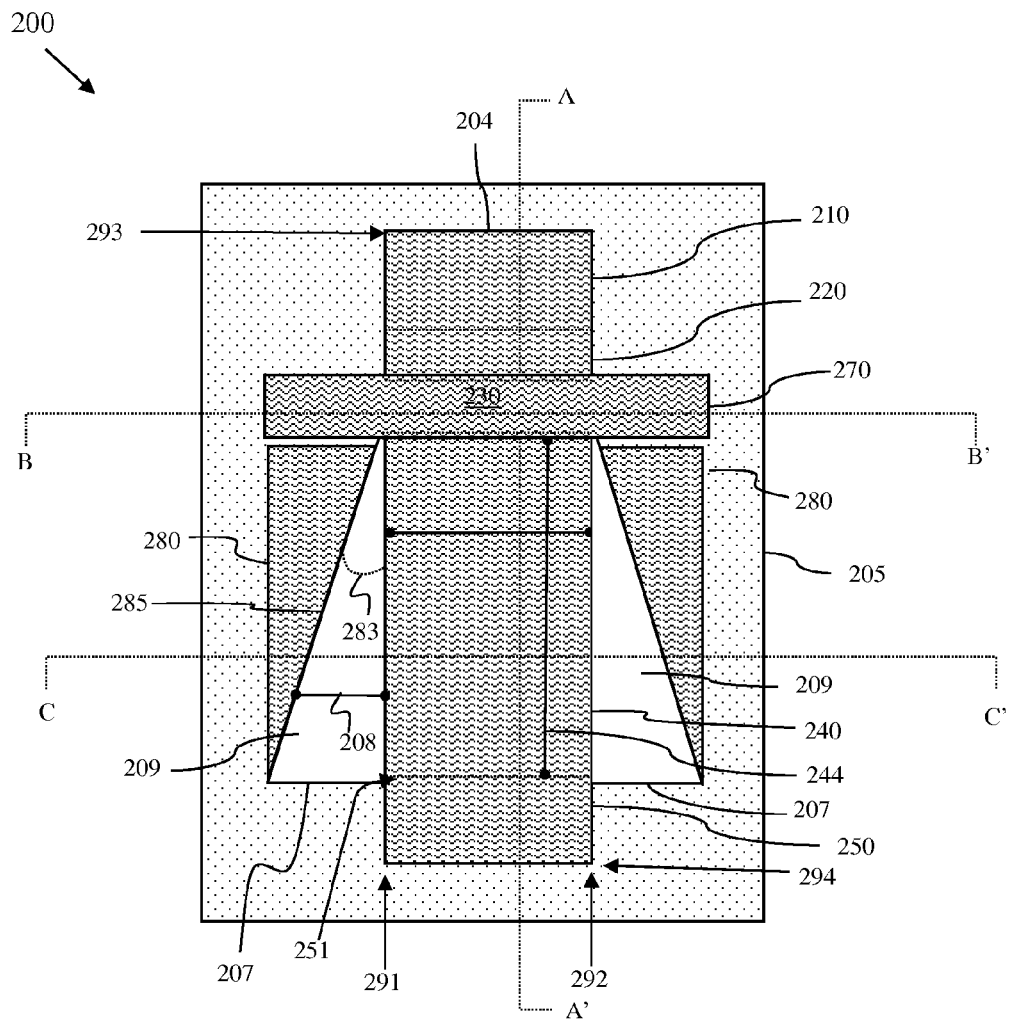
FIG. 2 is a top view diagram illustrating another embodiment of an LEDMOSFET.
Figure 3:
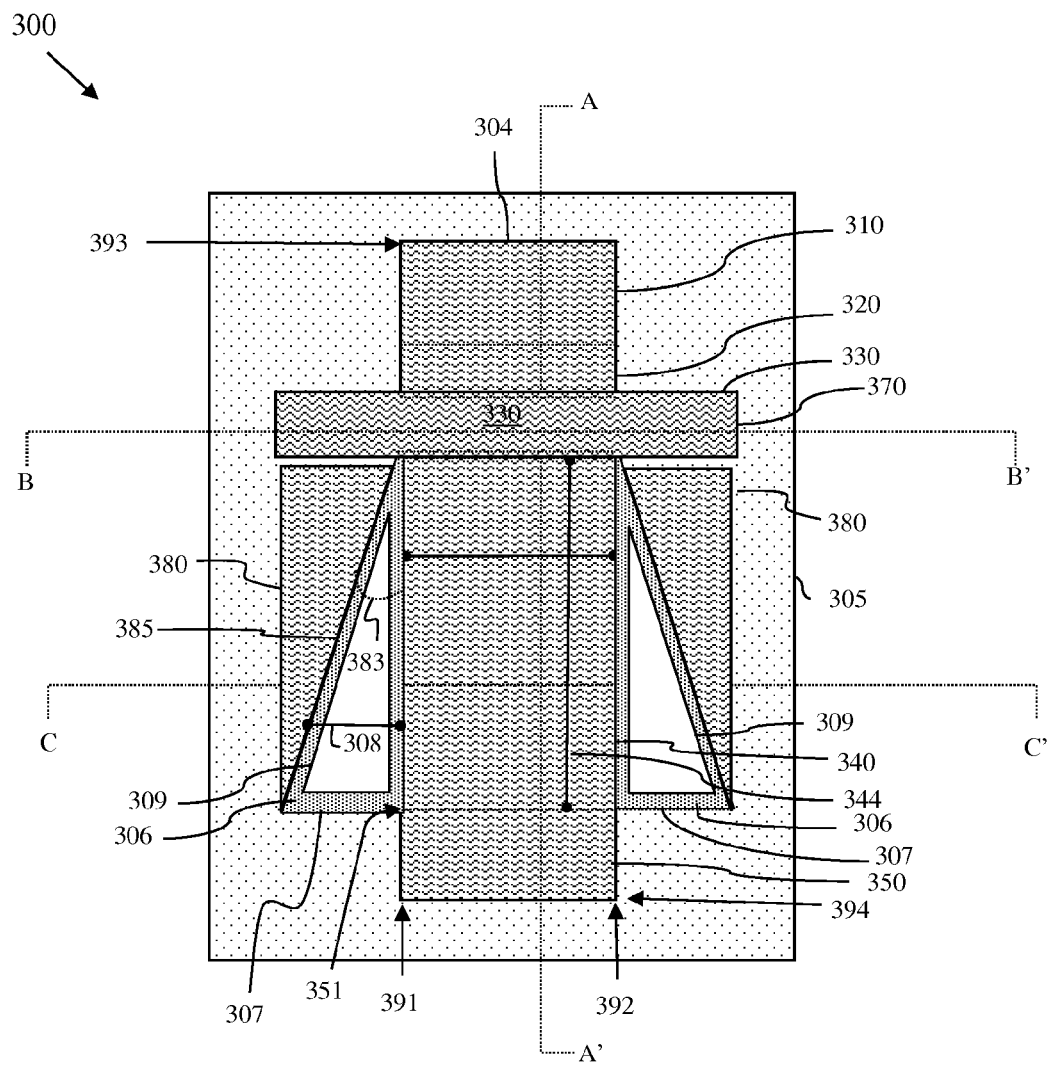
FIG. 3 is a top view diagram illustrating yet another embodiment of an LEDMOSFET.

More particularly, disclosed herein are embodiments of a lateral, extended drain, metal oxide semiconductor, field effect transistor (LEDMOSFET) 100 (see FIG. 1), 200 (see FIG. 2) or 300 (see FIG. 3).

Referring to FIGS. 1, 2 and 3, each of the LEDMOSFETs 100, 200, 300 can comprise a semiconductor body 104, 204, 304 (e.g., an essentially rectangular shaped semiconductor body). The semiconductor body 104, 204, 304 can have a top surface, opposing sidewalls (i.e., a first sidewall 191, 291, 391 and a second sidewall 192, 292, 392 opposite the first sidewall), and opposing ends (i.e., a first end 193, 293, 393 and a second end 194, 294, 394 opposite the first end). An isolation region 105, 205, 305 can be positioned laterally around and can define the shape of the semiconductor body 104, 204, 304.

Figure 4:
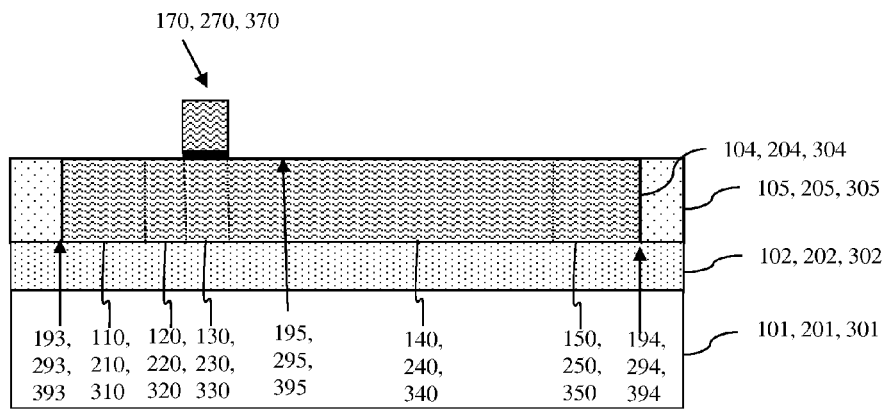
FIG. 4 is a cross-section diagram illustrating the LEDMOSFET, as in FIG. 1, FIG. 2 or FIG. 3 through a vertical plane A-A'.

FIG. 4 is a cross-section diagram illustrating the LEDMOSFET 100 of FIG. 1, the LEDMOSFET 200 of FIG. 2 or the LEDMOSFET 300 of FIG. 3 through a vertical plane A-A' that cuts across the center of the device along its length.

As illustrated in FIG. 4, the semiconductor body 104, 204, 304 of each of the LEDMOSFETs 100, 200, 300 can comprise a portion of a semiconductor layer of a semiconductor-on-insulator (SOI) wafer (e.g., a silicon-on-insulator wafer). Such an SOI wafer can comprise a semiconductor substrate 101, 201, 301 (e.g., a silicon substrate or other semiconductor substrate), an insulator layer 102, 202, 302 (e.g., a silicon dioxide ($SiO_2$) layer or other suitable insulator layer) on the substrate 101, 201, 301 and a semiconductor layer (e.g., a single crystalline silicon layer, a single crystalline gallium nitride layer or other suitable semiconductor layer) on the insulator layer 102, 202, 302. The portion of the semiconductor layer that makes up the semiconductor body 104, 204, 304 can be defined, for example, by an isolation region 105, 205, 305. The isolation region 105, 205, 305 can comprise, for example, a conventional shallow trench isolation (STI) structure comprising a patterned trench that extends vertically through the semiconductor layer to the insulator layer 102, 202, 302 and that is filled with one or more isolation materials (e.g., a silicon dioxide ($SiO_2$), silicon nitride (SiN), silicon oxynitride (SiON), etc.).

Alternatively, the semiconductor body 104, 204, 304 can comprise a defined portion of a bulk semiconductor wafer (e.g., a single crystalline silicon wafer or any other suitable wafer, such as a hybrid orientation (HOT) wafer) (not shown).

In any case, the semiconductor body 104, 204, 304 of the LEDMOSFETs 100, 200, 300 can comprise a plurality of doped regions. For example, the semiconductor body 104, 204, 304 can comprise the doped regions typically found in an LEDMOSFET in order to achieve a relatively fast switching speed, while minimizing short channel effects. That is, the semiconductor body 104, 204, 304 can comprise: a source region 110, 210, 310 at the first end 193, 293, 393; a drain region 150, 250, 350 at the second end 194, 294, 394; and a channel region 130, 230, 330 positioned laterally between the source region 110, 210, 310 and the drain region 150, 250, 350. The channel region 130, 230, 330 can have a first conductivity type and the source region 110, 210, 310 and drain region 150, 250, 350 can have a second conductivity type different from the first conductivity type.

Optionally, the semiconductor body 104, 204, 304 can further comprise a halo region 120, 220, 320 and/or a source drift region (not shown) positioned laterally between the source region 110, 210, 310 and the channel region 130, 230, 330. The halo region 120, 220, 320 can have the same conductivity type as the channel region 130, 230, 330, but can be doped at a higher concentration so as to reduce short channel effects (e.g., increase threshold voltage (Vt), reduce punch, etc.). The source drift region can have the same conductivity type as the source region 110, 210, 310, but can be doped at a lesser concentration. The semiconductor body 104, 204, 304 can further comprise a drain drift region 140, 240, 340, but no halo region, positioned laterally between the channel region 130, 230, 330 and the drain region 150, 250, 350. The drain drift region 140, 240, 340 can be relatively long such that the distance 144, 244, 344 between the channel region 130, 230, 330 and the drain region 150, 250, 350 is longer than the distance 124, 224, 324 between the channel region 130, 230, 330 and the source region 110, 210, 310. The drain drift region 140, 240, 340 can also have the same conductivity type as the drain region 110, 210, 310, but can be doped at a lesser concentration.

Thus, each of the LEDMOSFETs 100, 200, 300 can be asymmetric with respect to the source/drain extension (i.e., drift region) configuration and, optionally, with respect to the halo configuration. Such asymmetry allows for decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects within the LEDMOSFETs 100, 200 without decreasing switching speed.

Figure 5:
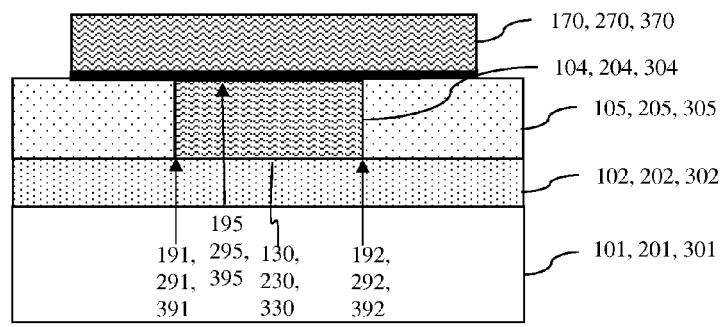
FIG. 5 is a cross-section diagram illustrating the LEDMOSFET, as in FIG. 1, FIG. 2 or FIG. 3 through a vertical plane B-B'.

As further illustrated, each of the LEDMOSFETs 100, 200, 300 can further comprise a gate structure 170, 270, 370 overlying the channel region 130, 230, 330. The gate structure 170, 270, 370 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The gate structure 170, 270, 370 can be positioned adjacent to the channel region 130, 230, 330 on the top surface 195, 295, 395 only of the semiconductor body 104, 204, 304 such that the LED- MOSFETs 100, 200, 300 are planar LEDMOSFETs. Specifically, FIG. 5 is a cross-section diagram illustrating the LEDMOSFET 100 of FIG. 1, the LEDMOSFET 200 of FIG. 2 or the LEDMOSFET 300 of FIG. 3 through a vertical plane B-B' that cuts across the device along its width and, particularly, through the gate structure 170, 270. As illustrated in FIG. 5, the gate structure 170, 270, 370 may be positioned on the top surface 195, 295, 395 only of the semiconductor body 104, 204, 304 traversing the channel region 130, 230, 330 and extending laterally onto the top surface of the isolation region 105, 205, 305. In this case, the LEDMOSFETs 100, 200, 300 can comprise planar LEDMOSFETs each with a channel region 130, 230, 330 that exhibits only one-dimensional field effects.

Figure 6:
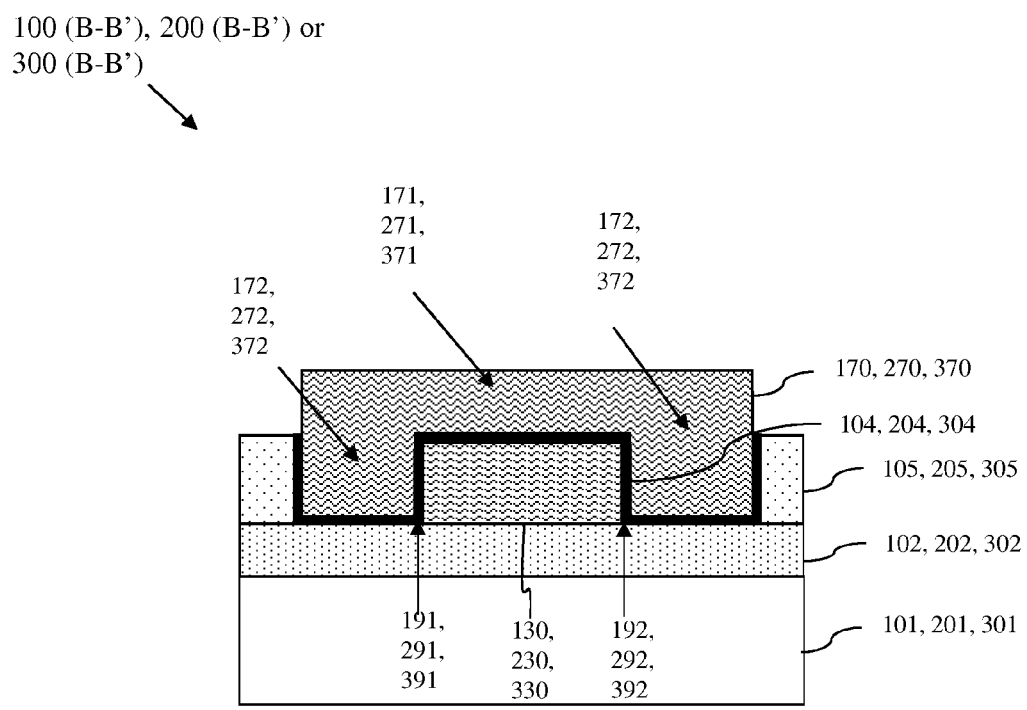
FIG. 6 is an alternative cross-section diagram illustrating the LEDMOSFET, as in FIG. 1, FIG. 2 or FIG. 3 through the vertical plane B-B'.

Alternatively, the gate structure 170, 270, 370 can be positioned adjacent to the channel region 130, 230, 330 on both the top surface 195, 295, 395 and opposing sidewalls 191-192, 291-292, 391-392 of the semiconductor body 104, 204, 304 such that the LEDMOSFETs 100, 200, 300 are non-planar LEDMOSFETs. Specifically, FIG. 6 is an alternative cross-section diagram illustrating the LEDMOSFET 100 of FIG. 1, the LEDMOSFET 200 of FIG. 2 or the LEDMOSFET 300 of FIG. 3 through a vertical plane B-B' that cuts across the device along its width and, particularly, through the gate structure 170, 270, 370. As illustrated in FIG. 6, the gate structure 170, 270, 370 may have a horizontal portion 171, 271, 371 positioned on the top surface 195, 295, 395 of the semiconductor body 104, 204, 304 traversing the channel region 130, 230, 330 and vertical portions 172, 272, 372 positioned on the opposing sidewalls 191-192, 291-292, 391-392 of the semiconductor body also adjacent to the channel region 130, 230, 330. In this case, the LEDMOSFETs 100, 200, 300 can comprise non-planar LEDMOSFETs each with a channel region 130, 230, 330 that exhibits multi-dimensional and, particularly, three-dimensional field effects.

Referring again to FIGS. 1, 2, and 3, each of the LEDMOSFETs 100, 200, 300 can further comprise tapered dielectric field plates 107, 207, 307 positioned adjacent to the opposing sidewalls 191-192, 291-292, 391-392 of the semiconductor body 104, 204, 304 at the drain drift region 140, 240, 340 and conductive field plates 180, 280, 380 positioned adjacent to the tapered dielectric field plates 107, 207, 307 such that each tapered dielectric field plate 107, 207, 307 is positioned laterally between the drain drift region 140, 240, 340 and a conductive field plate 180, 280, 380. Each conductive field plate 180, 280, 380 can be angled such that each tapered dielectric field plate 107, 207, 307, which is positioned laterally between a conductive field plate 180, 280, 380 and the drain drift region 140, 240, 340, has a continuously increasing width 108, 208, 308 (e.g., a linearly increasing width) along the length 144, 244, 344 of the drain drift region 140, 240, 340 from adjacent the channel region 130, 230, 330 to adjacent the drain region 150, 250, 350. In other words, each conductive field plate 180, 280, 380 can have a sidewall 185, 285, 385 that is angled (e.g., see angle 183, 283, 383) relative to the drain drift region 140, 240, 340 such that the spacing between the drain drift region 140, 240, 340 and the conductive field plate 180, 280, 380, which makes up the tapered dielectric field plate 107, 207, 307 increases continuously (e.g., linearly) along the length 144, 244, 344 of the drain drift region 140, 240, 340 from the channel region 130, 230, 330 to the drain region 150, 250, 350.

As illustrated, the conductive field plates 180, 280, 380 can comprise discrete, independently biasable, structures, such as discrete doped semiconductor shapes (e.g., doped silicon or doped polysilicon shapes) or discrete metal shapes (e.g., see the conductive field plates disclosed U.S. Patent Application Publication No. 20120168817, incorporated herein by reference above). Alternatively, the conductive field plates 180, 280, 380 can comprise extensions of the gate structure 170, 270, 370. That is, the gates structure 170, 270, 370 can be patterned such that it, not only traverses the channel region 130, 230, 330, but also so that it has extensions (i.e., additional sections) that form the above-described conductive field plates 180, 280, 380 (e.g., see the conductive field plates disclosed in U.S. Patent Application Publication No. 20120168766).

Such dielectric and conductive field plates form plate capacitors that can create an essentially uniform horizontal electric field profile within the drain drift region of the semiconductor body so that the LEDMOSFET 100, 200, 300 can exhibit a specific, relatively high, breakdown voltage (Vb). For example, plate capacitors formed by positioning the conductive field plates 180, 280, 380 and tapered dielectric field plates 107, 207, 307 adjacent to the drain drift region 140, 240, 340 can increase the drain-to-body breakdown voltage (Vb) of the LEDMOSFET 100, 200, 300 (e.g., up to or over 40 volts) so that the LEDMOSFET 100, 200, 300 has a specific Vb that is suitable for high voltage applications (e.g., switch or micro-electronic mechanical (MEMS) applications).

It should be noted that if the conductive field plates 180, 280, 380 comprise semiconductor material (e.g., discrete silicon or polysilicon shapes or polysilicon gate structure extensions), the semiconductor material can be doped so as to have the same conductivity type as the drain drift region 140, 240, 340 (i.e., the second conductivity type) or an opposite conductivity type (i.e., the first conductivity type). However, preferably the semiconductor material of the conductive field plates 180, 280, 380 will be doped so as to have the opposite conductivity type (i.e., the first conductivity type) because, in this case, the depletion of the drain drift region 140, 240, 340 will occur both faster and deeper (i.e., towards the center of the drain drift region 140, 240, 340), thereby resulting in an increase in the drain-to-body breakdown voltage (Vb).

It should further be noted that the dimensions of the tapered dielectric field plates 107, 207, 307 including, but not limited to, the length and maximum width of such tapered dielectric field plates, and the dimensions of the conductive field plates including, but not limited to, the angle 183, 283, 383 at which the sidewall 185, 285, 385 is positioned relative to the semiconductor body 104, 204, 304 and the length of the sidewall 185, 285, 385 can be predefined based on the dimensions and doping profile of the drain drift region 140, 240, 340 so as to ensure creation of a strong uniform horizontal electric field profile within the drain drift region 140, 240, 340 of the semiconductor body 104, 204, 304 (i.e., from the channel region 130, 230, 330 to the drain region 150, 250, 350). This strong uniform electric field profile limits the transverse field to the nwell/pwell junction, limits the ionization rate to a safe, low values and allows the drain drift region 140, 240, 340 to be efficiently depleted so that a specific relatively high drain-to-body breakdown voltage (Vb) (e.g., Vb=15-50 volts) can be achieved.

As mentioned above, the incorporation of conductive field plates and tapered dielectric field plates into an LEDMOSFET was previously disclosed in U.S. Patent Application Publication No. 20120168766 and U.S. Patent Application Publication No. 20120168817, incorporated by reference above. Thus, the details related to calculating the dimensions of both the conductive field plates and the tapered dielectric field plates are omitted from this specification in order to allow the reader to focus on the salient aspects of the disclosed embodiments. However, it should be noted that the LEDMOSFET structures disclosed in U.S. Patent Application Publication No. 20120168766 and U.S. Patent Application Publication No. 20120168817, the tapered dielectric field plates were solid and, particularly, were solid essentially triangular portions of a trench isolation region comprising silicon dioxide (SiO$_2$), silicon nitride (SiN), silicon oxynitride (SiON), etc. While such solid tapered dielectric field plates are suitable for the purposes for which they were designed, the present embodiments improve upon the tapered dielectric field plate structure in order to better control creation of the uniform horizontal electric field profile within the drain drift region and, thereby to better ensure that the LEDMOSFET exhibits the specific, relatively high, breakdown voltage (Vb) desired.

Specifically, in the embodiments of the LEDMOSFET 100, 200, 300 disclosed herein and illustrated in FIGS. 1-3, respectively, the tapered dielectric field plates 107, 207, 307 can each incorporate a cavity 109, 209, 309 filled with air or gas (i.e., an airgap or void), in whole or in part. Such an air or gas-filled cavity has a lower dielectric constant than other typically used dielectric field plate isolation materials. Thus, it allows for better control over the creation of the uniform horizontal electric field profile within the drain drift region 140, 240, 340, as compared to tapered dielectric field plates without such airgaps 109, 209, 309 and, thereby ensures that the LEDMOSFETs 100, 200, 300 exhibit the specific, relatively high, breakdown voltage (Vb) desired. More particularly, in the disclosed embodiments, the field across the field plates is easier to couple because the dielectric field plates 107, 207, 307 comprise the air or gas-filled cavities 109, 209, 309, which have a lower dielectric constant than solid dielectric materials; hence, depletion of the drain drift region 140, 240, 340 will require a lower voltage. Coupling through the dielectric field plates 107, 207, 307, which comprise the air or gas-filled cavities 109, 209, 309, is also stronger. This stronger coupling helps to keep the depletion in the drain drift region 140, 240, 340 deeper (i.e., toward the center of the drain drift region) such that the field profile is more uniform. Another advantage of using dielectric field plates 107, 207, 307, which comprise air or gas-filled cavities 109, 209, 309, is related to the consumed chip area. That is, for the same high breakdown voltage (Vb), dielectric field plates 107, 207, 307, which comprise air or gas-filled cavities 109, 209, 309, will take up less than half of the chip area required for dielectric field plates comprising other typically used dielectric field plate isolation materials.

Figure 7:
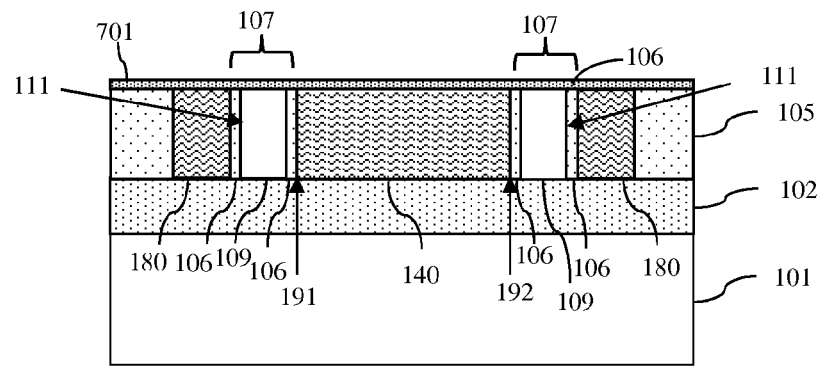
FIG. 7 is a cross-section diagram illustrating the LEDMOSFET, as in FIG. 1, through the vertical plane C-C'.

For example, FIG. 7 is a cross-section diagram illustrating the specifically the LEDMOSFET 100 through a vertical plane C-C', as shown in FIG. 1, that cuts across the device along its width and, particularly, through the conductive field plates 180, tapered dielectric field plates 107 and drain drift region 140. Referring to FIG. 7 in combination with FIG. 1, in the LEDMOSFET 100, each tapered dielectric field plate 107 can be positioned laterally between the drain drift region 140 of the semiconductor body 104 and a conductive field plate 180 and can have a width 108 that continuously increases along the length 144 of the drain drift region 140 from the channel region 130 to the drain region 150. Each tapered dielectric field plate 107 can comprise the essentially triangular shaped portion 106 of the isolation region 105 that is between the drain drift region 140 of the semiconductor body 104 and the conductive field plate 180 and, contained within that portion 106, a cavity 109 filled with air or gas (i.e., an airgap or void). The cavity 109 can be defined by sidewalls of a trench 111 patterned within the portion 106 of the isolation region 105 between semiconductor body 104 and the conductive field plate 180. This cavity 109 (i.e., the trench 111 within the portion 106 of the isolation region 105) can extend vertically to at least the top surface of isolation layer 102 below (e.g., in the case of a semiconductor-on-insulator (SOI) structure) and can further be capped by a dielectric cap layer 701. This dielectric cap layer 701 can comprise, for example, a silicon dioxide (SiO$_2$) layer, a silicon nitride (SiN) layer, silicon oxynitride (SiON) layer, etc. As discussed in greater detail below with regard to the method embodiments, selection of the material used for the dielectric cap layer 701 will depend upon the processes used to form the cavities 109. Thus, in this embodiment, each cavity 109 is bounded laterally by the STI 105, bounded below by the isolation layer 102 and bounded above by the dielectric cap layer 701.

It should be noted that in this LEDMOSFET 100, the portions 106 of the isolation region 105 between the drain drift region 140 of the semiconductor body 104 and each of the conductive field plates 180 can have an essentially triangular shape such that the width of each tapered dielectric field plate 107 increases linearly along the length of the drain drift region 140 from the channel region 130 to the drain region 150. Furthermore, each cavity 109 can similarly have an essentially triangular shape. For example, each cavity 109 can have the same essentially triangular shape as the portion 106 of the isolation region 105 between each conductive field plate 180 and the drain drift region 140, can be smaller in size than that portion 106 of the isolation region 105, and can be centered within that portion 106 of the isolation region 105.

Figure 8:
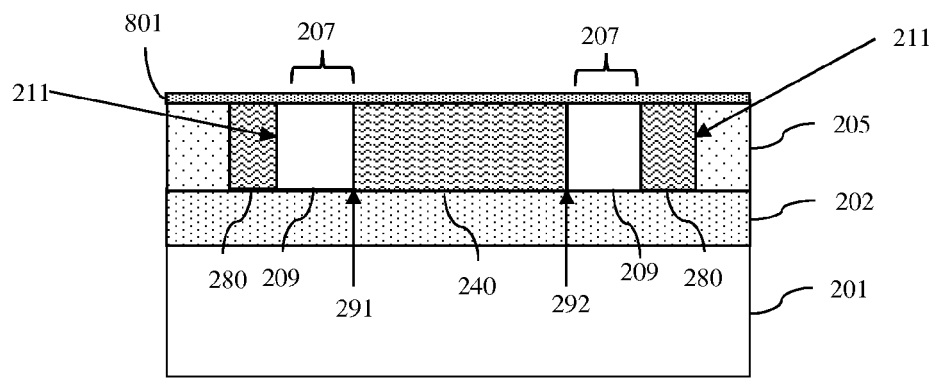
FIG. 8 is a cross-section diagram illustrating the LEDMOSFET, as in FIG. 2, through the vertical plane C-C'.

FIG. 8 is a cross-section diagram illustrating the LEDMOSFET 200 through a vertical plane C-C', as shown in FIG. 2, that cuts across the device along its width and, particularly, through the conductive field plates 280, tapered dielectric field plates 207 and drain drift region 240.

Referring to FIG. 8 in combination with FIG. 2, in the LEDMOSFET 200, each tapered dielectric field plate 207 can be positioned laterally between the drain drift region 240 of the semiconductor body 204 and a conductive field plate 280 and can have a width 208 that continuously increases along the length 244 of the drain drift region 240 from the channel region 230 to the drain region 250. Each tapered dielectric field plate 207 can comprise, in its entirety, a cavity 209 filled with air or gas (i.e., an airgap or void). The cavity 209 can comprise a trench 211, which is defined by vertical surfaces (i.e., sidewalls) of the semiconductor body 204 at the drain drift region 240, of the conductive field plate 280 and of the isolation region 205, which is positioned laterally around the semiconductor body 204. The cavity 209 (i.e., the trench 211) can extend vertically to at least the top surface of the isolation layer 202 below (e.g., in the case of a semiconductor-on-insulator (SOI) structure) and can further be capped by a dielectric cap layer 801. This dielectric cap layer 801 can comprise, for example, a silicon dioxide (SiO$_2$) layer, a silicon nitride (SiN) layer, silicon oxynitride (SiON) layer, etc. As discussed in greater detail below with regard to the method embodiments, selection of the material used for the dielectric cap layer 801 will depend upon the processes used to form the cavities 209. Thus, in this embodiment, each cavity 209 is bounded laterally by semiconductor body at the drain drift region 240, the conductive field plate 180 and the STI 105, bounded below by the isolation layer 202 and bounded above by the dielectric cap layer 801.

It should be noted that in this embodiment of the LEDMOSFET 200, the cavities 209 between the drain drift region 240 of the semiconductor body 204 and each of the conductive field plates 280 can have an essentially triangular shape such that the width of each tapered dielectric field plate 207 increases linearly along the length of the drain drift region 240 from the channel region 230 to the drain region 250.

Figure 9:
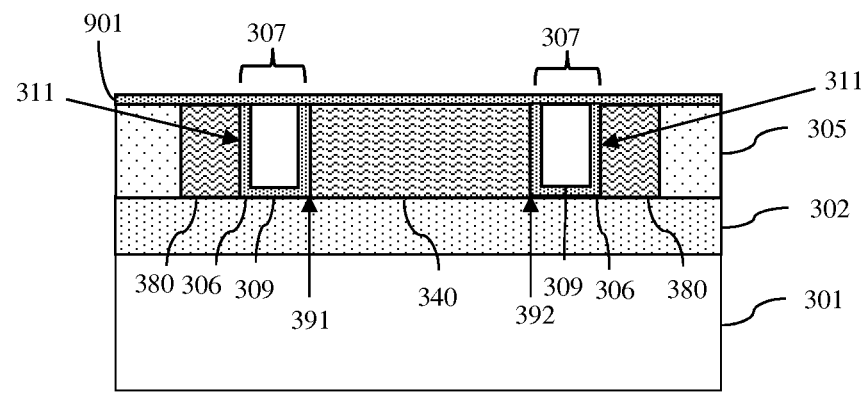
FIG. 9 is a cross-section diagram illustrating the LEDMOSFET, as in FIG. 3, through the vertical plane C-C'.

Referring to FIG. 9 in combination with FIG. 3, in the LEDMOSFET 300, each tapered dielectric field plate 307 can be positioned laterally between the drain drift region 340 of the semiconductor body 304 and a conductive field plate 380 and can have a width 308 that continuously increases along the length 344 of the drain drift region 340 from the channel region 330 to the drain region 350. Each tapered dielectric field plate 307 can comprise a cavity 309. Each cavity 309 can be filled with air or gas (i.e., an airgap or void) and can be contained within a trench 311, which is lined with a dielectric liner 306. The trench 311 can be defined by vertical surfaces (i.e., sidewalls) of the semiconductor body 304 at the drain drift region 340, of the conductive field plate 380 and of the isolation region 305, which is positioned laterally around the semiconductor body 304. The trench 311 can extend vertically to at least the top surface of the isolation layer 302 below (e.g., in the case of a semiconductor-on-insulator (SOI) structure). The dielectric liner 306 can comprise, for example, a silicon dioxide ($SiO_2$) liner, a silicon nitride (SiN) liner, silicon oxynitride (SiON) liner, etc. The trench 311 and, particularly, the air or gas-filled cavity 309 within the trench 311 can further be capped by a dielectric cap layer 901. This dielectric cap layer 901 can comprise, for example, a silicon dioxide ($SiO_2$) layer, a silicon nitride (SiN) layer, silicon oxynitride (SiON) layer, etc. As discussed in greater detail below with regard to the method embodiments, selection of the material used for the dielectric liner 306 and the dielectric cap layer 901 will depend upon the processes used to form the cavities 309. Thus, in this embodiment, each cavity 309 is bounded laterally and below by the dielectric liner 306 and bounded above by the dielectric cap layer 901.

It should be noted that in this embodiment of the LEDMOSFET 300, the cavities 309 between the drain drift region 340 of the semiconductor body 304 and each of the conductive field plates 380 can have an essentially triangular shape such that the width of each tapered dielectric field plate 307 increases linearly along the length of the drain drift region 340 from the channel region 330 to the drain region 350.

For illustration purposes, the dielectric field plates 107, 207, 307 and air or gas-filled cavities 109, 209, 309 thereof in each of the above-described LEDMOSFETs 100, 200, 300 are shown in FIGS. 1-3, respectively, as being perfectly triangular with three clearly defined vertices (i.e., corners). However, it should be understood that in practice, due to the method steps used to form these triangular shapes, the vertices may in fact be curved or rounded.

Those skilled in the art will recognize that, like other non-planar, multi-gate FETs, the effective channel width and, thereby the drive current, can be increased by incorporating multiple fingers (i.e., fins) into the structure extending laterally between the source region and the drain region. In the case of LEDMOSFETs, each finger will comprise a corresponding channel region and a drain drift region between the channel region and the drain region. Additionally, tapered dielectric field plates can be positioned adjacent to the opposing sidewalls of each finger at the drain drift region, conductive field plates can be positioned adjacent to the tapered dielectric field plates such that each tapered dielectric field plate is positioned laterally between a drain drift region and a conductive field plate and, optionally, any conductive field plate between adjacent fingers can be shared (e.g., as disclosed in U.S. Patent Application Publication No. 20120168766 and U.S. Patent Application Publication No. 20120168817, incorporated by reference above). Thus, it should be understood that tapered dielectric field plates comprising cavities filled with air or gas (i.e., comprising airgaps or voids), as disclosed herein and shown in FIGS. 1-3, can also be incorporated into a multi-finger LEDMOSFET structure to better control creation of the uniform horizontal electric field profile within each drain drift region in each finger and, thereby to better ensure that the multi-finger LEDMOSFET exhibits the specific, relatively, high breakdown voltage (Vb) desired.

Figure 10:
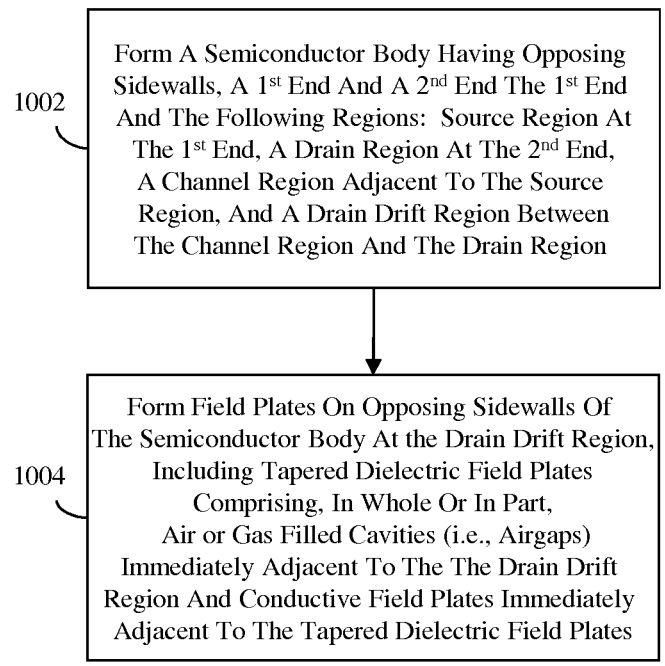
FIG. 10 is a flow diagram illustrating generally embodiments of a method of forming an LEDMOSFET, as in FIG. 1, FIG. 2 or FIG. 3.

Referring to FIG. 10, also disclosed herein are embodiments of a method of forming a lateral, extended drain, metal oxide semiconductor, field effect transistor (LEDMOSFET), such as the LEDMOSFET 100 of FIG. 1, the LEDMOSFET 200 of FIG. 2 or the LEDMOSFET 300 of FIG. 3.

Specifically, referring to FIG. 10 in combination with FIGS. 1-3, each of these method embodiments can comprise forming a semiconductor body 104, 204, 304 having opposing sidewalls 191-192, 291-292, 391-392, a first end 193, 293, 393 and a second end 194, 294, 394 opposite the first end (1002). This semiconductor body 104, 204, 304 can further have the following regions: a source region 110, 210, 310 at the first end 193, 293, 393; a drain region 150, 250, 350 at the second end 194, 294, 394; a channel region 130, 230, 330 positioned laterally between the source region 110, 210, 310 and the drain region 150, 250, 350; a optional halo region 120, 220, 320 and/or a source drift region (not shown) positioned laterally between the source region 110, 210, 310 and the channel region 130, 230, 330; and a drain drift region 140, 240, 340 but no halo region, positioned laterally between the channel region 130, 230, 330 and the drain region 150, 250, 350. The drain drift region 140, 240, 340 can be relatively long such that the distance 144, 244, 344 between the channel region 130, 230, 330 and the drain region 150, 250, 350 is longer than the distance 124, 224, 324 between the channel region 130, 230, 330 and the source region 110, 210, 310.

It should be understood that these regions can be pre-doped or, alternatively, can be doped at various different times during the manufacturing process after semiconductor body 104, 204, 304 formation so as to have, for example, the following conductivity types and levels: the channel region 130, 230, 330 has a first conductivity type; the source region 110, 210, 310 and drain region 150, 250, 350 have second conductivity type different from the first conductivity type; the halo region 120, 220, 320 has the first conductivity type at a higher level than the channel region 130, 230, 330; the source drift region has second conductivity type, but can at a lower conductivity level the source region 110, 210, 310; and the drain drift region 140, 240, 340 has the second conductivity type at lower conductivity level than the drain region 150, 250, 350.

Additionally, each of these method embodiments can comprise forming tapered dielectric field plates 107, 207, 307 comprising, in whole or in part, cavities 109, 209, 309 filled with air or gas (i.e., airgaps or voids), adjacent to the opposing sidewalls 191-192, 291-292, 391-392 of the semiconductor body 104, 204, 304 at the drain drift region 140, 240, 340 and conductive field plates 180, 280, 380 adjacent to the tapered dielectric field plates 107, 207, 307 (1004).

Specifically, at process 1004, tapered dielectric field plates 107, 207, 307 can be formed adjacent to the opposing sidewalls 191-192, 291-292, 391-392 of the semiconductor body 104, 204, 304 at the drain drift region 140, 240, 340 and conductive field plates 180, 280, 380 can be formed adjacent to the tapered dielectric field plates 107, 207, 307 such that each tapered dielectric field plate 107, 207, 307 is positioned laterally between a given side of the drain drift region 140, 240, 340 and a conductive field plate 180, 280, 380. Furthermore, each conductive field plate 180, 280, 380 can be formed at an angled relative to the drain drift region 140, 240, 340 of the semiconductor body 104, 204, 304 such that each tapered dielectric field plate 107, 207, 307 which is positioned laterally between a conductive field plate 180, 280, 380 and the drain drift region 140, 240, 340 has a continuously increasing width 108, 208, 308 (e.g., a linearly increasing width) along the length 144, 244, 344 of the drain drift region 140 from adjacent the channel region 130, 230, 330 to adjacent the drain region 150, 250, 350. In other words, each conductive field plate 180, 280, 380 can be formed so as to have a sidewall 185, 285, 385 that is angled (e.g., see angle 183, 283, 383) relative to the drain drift region 140, 240, 340 of the semiconductor body such that the spacing between the drain drift region 140, 240, 340 and the conductive field plate 180, 280, 380, which makes up the tapered dielectric field plate 107, 207, 307 increases continuously (e.g., linearly) along the length 144, 244, 344 of the drain drift region 140, 240, 340 from the channel region 130, 230, 330 to the drain region 150, 250, 350.

It should be noted that the dimensions of the tapered dielectric field plates 107, 207, 307 including, but not limited to, the length and maximum width of such tapered dielectric field plates, and the dimensions of the conductive field plates including, but not limited to, the angle 183, 283, 383 at which the sidewall 185, 285, 385 is positioned relative to the semiconductor body 104, 204, 304 and the length of the sidewall 185, 285, 385 can be predefined based on the dimensions and doping profile of the drain drift region 140, 240, 340 so as to ensure creation of a strong uniform horizontal electric field profile within the drain drift region 140, 240, 340 of the semiconductor body 104, 204, 304 (i.e., from the channel region 130, 230, 330 to the drain region 150, 250, 350). This strong uniform electric field profile limits the transverse field to the nwell/pwell junction, limits the ionization rate to a safe, low values and allows the drain drift region 140, 240, 340 to be efficiently depleted so that a specific relatively high drain-to-body breakdown voltage (Vb) (e.g., Vb=15-50 volts) can be achieved.

As mentioned above, techniques for incorporating conductive field plates and tapered dielectric field plates into an LEDMOSFET structure were previously disclosed in U.S. Patent Application Publication No. 20120168766 and U.S. Patent Application Publication No. 20120168817, incorporated by reference above. Thus, details related to calculating the dimensions of both the conductive field plates and the tapered dielectric field plates are omitted from this specification in order to allow the reader to focus on the salient aspects of the disclosed embodiments. However, it should be noted that the techniques used in U.S. Patent Application Publication No. 20120168766 and U.S. Patent Application Publication No. 20120168817, resulted in solid tapered dielectric field plates (i.e., tapered dielectric field plates comprising solid triangular portions of an isolation region, such as solid triangular portions of a trench isolation region filled with silicon dioxide ($SiO_2$), silicon nitride (SiN), silicon oxynitride (SiON), etc.). While such solid tapered dielectric field plates are suitable for the purposes for which they were designed, the present embodiments disclose different techniques for forming the tapered dielectric field plates that comprise, in whole or in part, cavities filled with air or gas (i.e., airgaps or voids) in order to better control creation of the uniform horizontal electric field profile within the drain drift region and, thereby to better ensure that the LEDMOSFET exhibits the specific, relatively high, breakdown voltage (Vb) desired.

More specifically, in one embodiment of the method, the tapered dielectric field plates 107 and conductive field plates 180 can be formed, as shown in FIG. 1, such that each tapered dielectric field plate 107 is positioned laterally between a given side of the semiconductor body 104 at the drain drift region 140 and a conductive field plate 180 and has a width 108 that continuously increases along the length 144 of the drain drift region 140 from the channel region 130 to the drain region 150. The tapered dielectric field plates 107 and conductive field plates 180 can further be formed, as shown in FIG. 1, such that each tapered dielectric field plate 107 comprises a portion 106 of an isolation region 105 between the drain drift region 140 of the semiconductor body 104 and the conductive field plate 180 and, contained within that portion 106 of the isolation region 105, a cavity 109 that extends vertically at least to the isolation layer 102 below (e.g., in the case of a semiconductor-on-insulator structure), that is filled with air or gas (i.e., an airgap or void), and that is capped by a dielectric cap layer 701. Thus, the cavity 109 will be bounded laterally by the STI 105, bounded below by the isolation layer 102 and bounded above by the dielectric cap layer 701.

Figure 11:
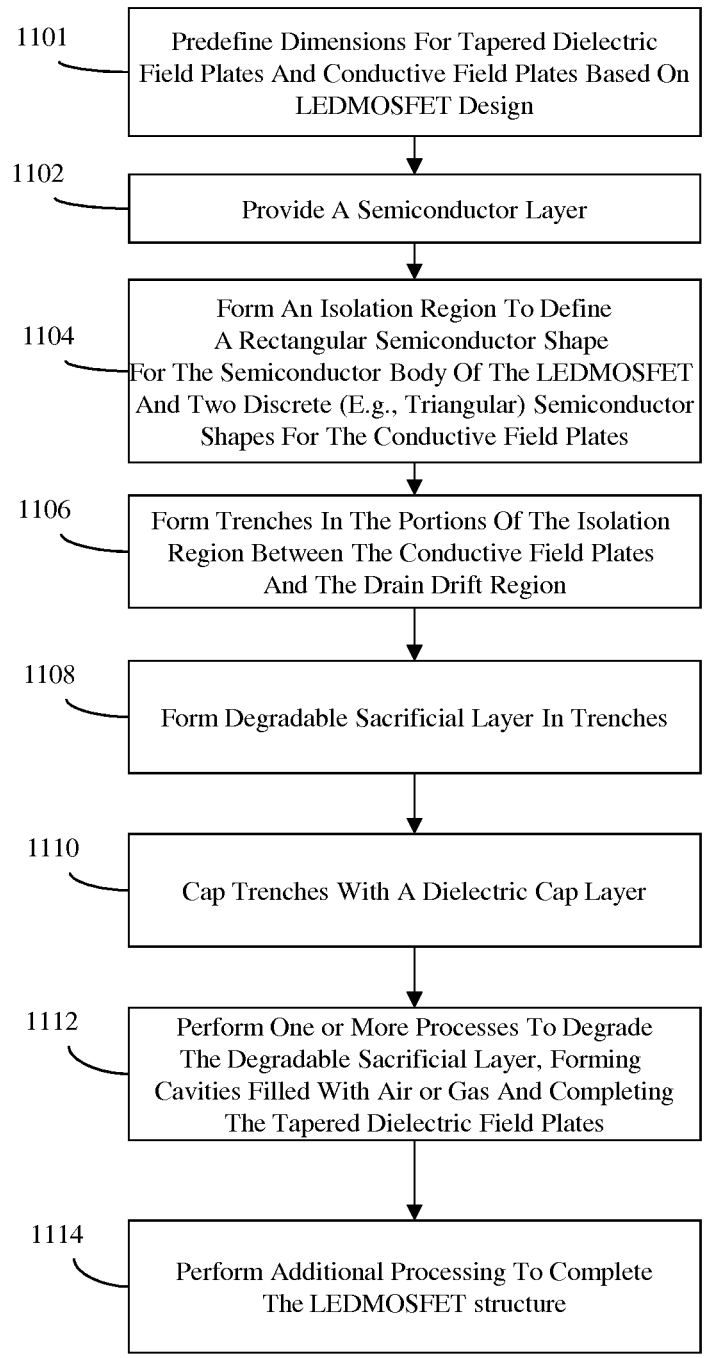
FIG. 11 is a flow diagram illustrating specifically an embodiment of a method for forming the LEDMOSFET of FIG. 1.

FIG. 11 is a flow diagram illustrating one technique that could be used to form the LEDMOSFET 100 as shown in FIG. 1. Specifically, this method embodiment can comprise predefining the dimensions of a tapered dielectric field plates and conductive field plates to be incorporated into an LEDMOSFET based on the LEDMOSFET design and, particularly, the dimensions of the drain drift region so that the drain drift region has an essentially uniform horizontal electric field profile from the channel region to the drain region and, thereby so that the LEDMOSFET will have a specific drain-to-body breakdown voltage (Vb) (1101).

Figure 12:
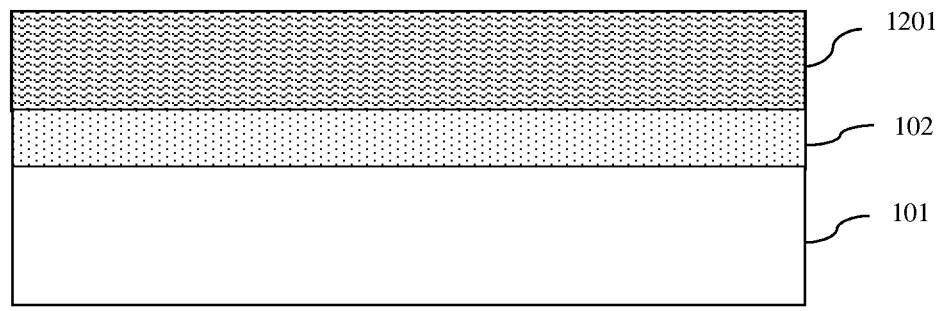
FIG. 12 is a cross-section diagram illustrating a partially completed LEDMOSFET 100 formed according to the flow diagram of FIG. 11.
Figure 13:
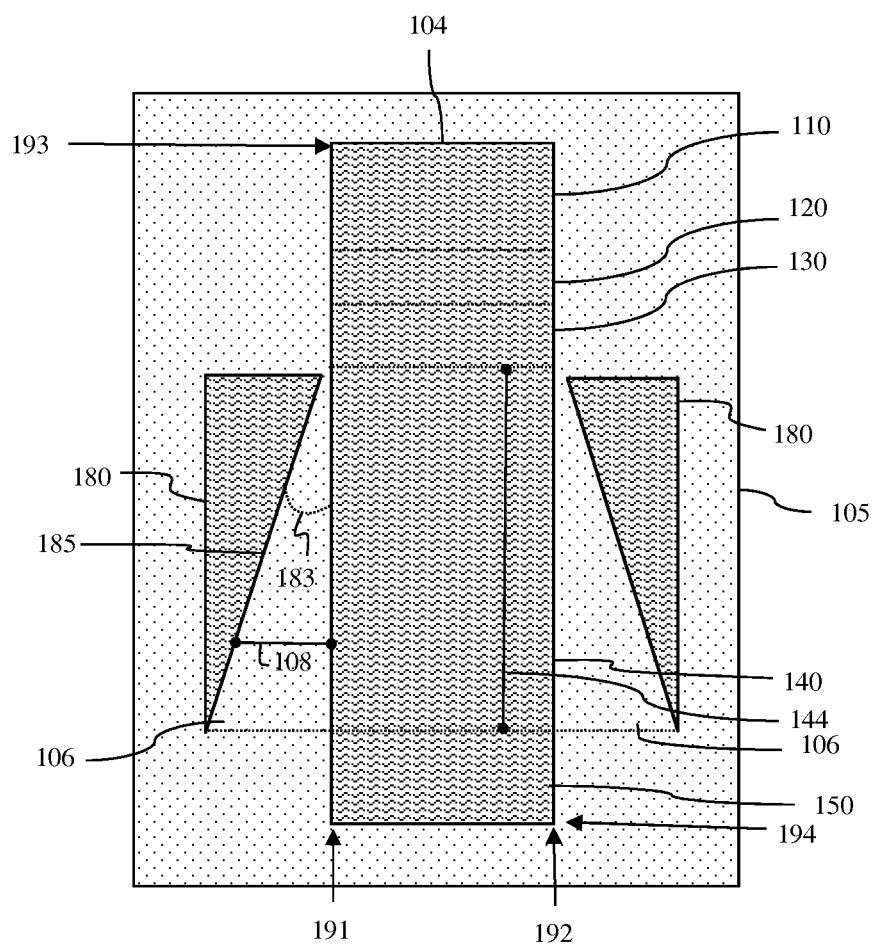
FIG. 13 is a top view diagram illustrating a partially completed LEDMOSFET 100 formed according to the flow diagram of FIG. 11.

Next, this method embodiment can comprise providing a semiconductor layer 1201 (1102, see FIG. 12). For example, this method embodiment can comprise providing a semiconductor-on-insulator (SOI) wafer (e.g., a silicon-on-insulator wafer). Such an SOI wafer can comprise a semiconductor substrate 101 (e.g., a silicon substrate or other semiconductor substrate), an insulator layer 102 (e.g., a silicon dioxide ($SiO_2$) layer or other suitable insulator layer) on the substrate 101 and a semiconductor layer 1201 (e.g., a single crystalline silicon layer, a single crystalline gallium nitride layer or other suitable semiconductor layer) on the insulator layer 102. Alternatively, the semiconductor layer 1001 can comprise a bulk semiconductor wafer (e.g., a single crystalline silicon wafer) (not shown).

Then, an isolation region 105 can be formed as to define, in the semiconductor layer 1201, a rectangular semiconductor shape for the semiconductor body 104 with the various regions (e.g., source region 110 at the first end 193, halo region 120, channel region 130, drain drift region 140 and drain region 150 at the second end 194), as discussed in detail above, as well as two discrete semiconductor shapes for the conductive field plates 180 on the opposing sides 191-192 of the semiconductor body 104 such that the conductive field plates 180 are separated from the opposing sides 191-192 of the semiconductor body 104 at the drain drift region 140 by portions 106 of the isolation region 105 (1104, see FIG. 12).

Such an isolation region 105 can be formed, for example, using conventional shallow trench isolation (STI) techniques. That is, a trench can be lithographically patterned and etched such that it defines the desired semiconductor body 104 and conductive field plate 180 shapes in the semiconductor layer 1201 and further such that it extends vertically through the semiconductor layer 1001 to the insulator layer 102 below. This trench can then be filled with one or more isolation materials (e.g., a silicon dioxide ($SiO_2$), silicon nitride (SiN), silicon oxynitride (SiON), etc.).

Figure 14:
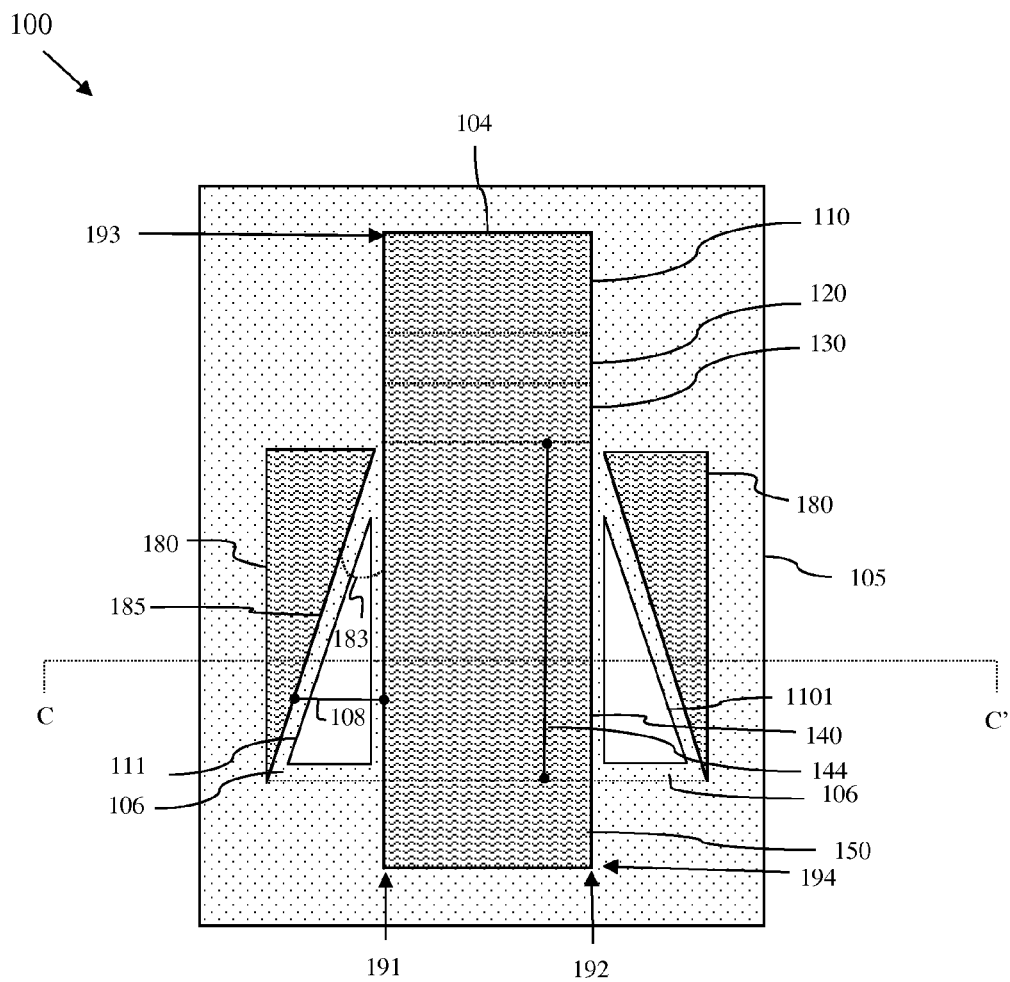
FIG. 14 is a top view diagram illustrating a partially completed LEDMOSFET 100 formed according to the flow diagram of FIG. 11.
Figure 15:
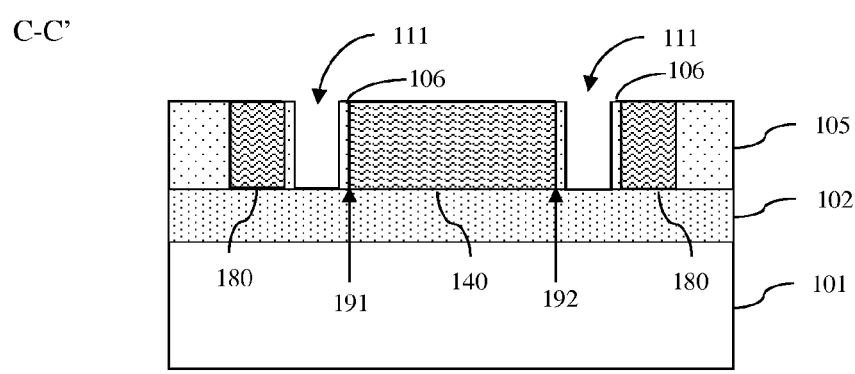
FIG. 15 is cross-section diagram illustrating a partially completed LEDMOSFET 100 formed according to the flow diagram of FIG. 11.

Once the isolation region 105 is formed, additional trenches 111 can be formed (e.g., using conventional lithographic patterning and etch techniques) in the essentially triangular portions 106 of the isolation region 105 between the semiconductor body 104 at the drain drift region 140 and the conductive field plates 180 (1106, see FIGS. 14 and 15). It should be noted that each trench 111 can have the same essentially triangular shape as the portion 106 of the isolation region 105 between each conductive field plate 180 and the drain drift region 140, can be smaller in size than that portion 106 of the isolation region 105, and can be centered within that portion 106 of the isolation region 105.

For illustration purposes, the portion 106 of isolation region 105 between each conductive field plate 180 and the drain drift region 140 and each trench 1201 contained therein are each shown as having three clearly defined vertices (i.e., corners). However, it should be understood that in practice, due to the method steps used, the vertices may in fact be curved or rounded.

Figure 16:
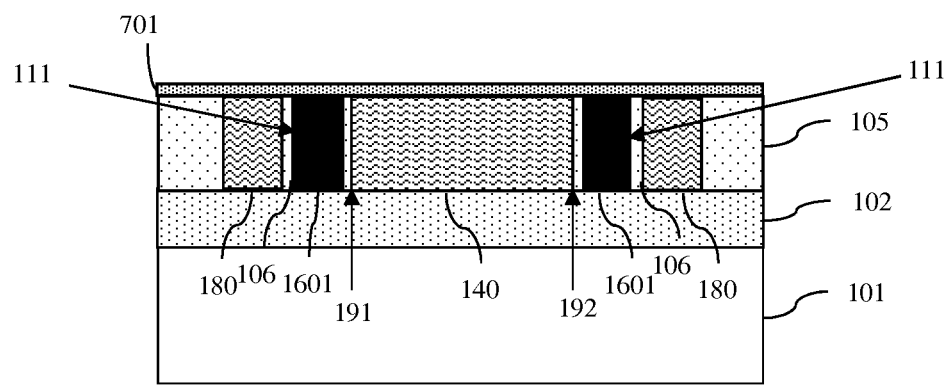
FIG. 16 is cross-section diagram illustrating a partially completed LEDMOSFET formed according to the flow diagram of FIG. 11.

Next, a degradable sacrificial layer 1601 can be formed (e.g., deposited) in the trenches 1601 (1108, see FIG. 16). This degradable sacrificial layer 1601 can comprise a degradable (i.e., decomposable) material, such as a thermally degradable material or a chemically degradable material. For example, this degradable sacrificial layer 1601 can comprise a thermally degradable polymer material or any other suitable thermally degradable material that will decompose into a gaseous state when the temperature of the material is raised above a decomposition temperature and/or when the material is exposed to ultra-violet (UV) radiation. Alternatively, this degradable sacrificial layer 1601 can comprise a chemically degradable and, particularly, a material that can be selectively etched over the isolation materials used for the STI 105 and isolation layer 102 which bound the trenches 111 laterally and below. Such a chemically degradable material can comprise, for example, polysilicon, germanium (Ge) or silicon germanium (SiGe)).

The dielectric cap layer 701 can be formed (e.g., deposited) so as to cap each of the trenches 111 (i.e., to cover the degradable sacrificial layer 1601 contained within the trenches 111 (1110, see FIG. 16). The dielectric cap layer 701 can comprise, for example, a silicon dioxide ($SiO_2$) layer, a silicon nitride (SiN) layer, silicon oxynitride (SiON) layer, or any other suitable dielectric cap layer. It should be understood that in the case where the degradable sacrificial layer 1601 is a chemically degradable sacrificial layer, the dielectric cap layer 701 should be preselected so that the chemically degradable sacrificial layer can be selectively etched over the dielectric cap layer 701.

Next, one or more suitable processes can be performed in order to degrade the degradable sacrificial layer 1601 within the trenches 111 and, thereby form the cavities 109 (1112).

Figure 17:
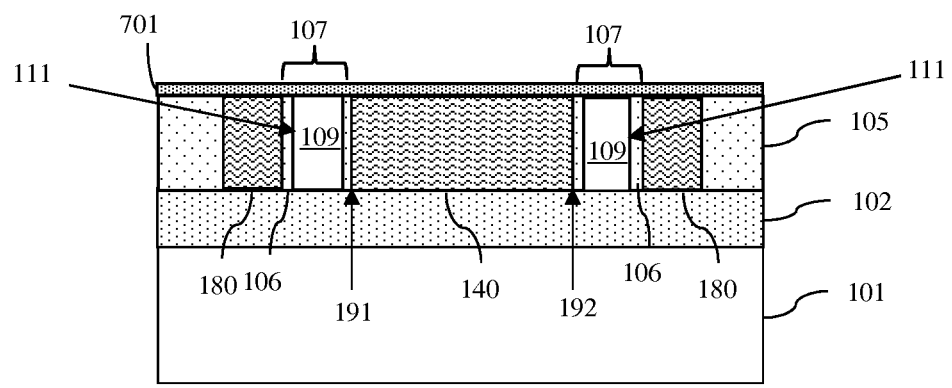
FIG. 17 is cross-section diagram illustrating a partially completed LEDMOSFET 100 formed according to the flow diagram of FIG. 11.

For example, if the degradable material used for the degradable sacrificial layer 1601 comprises a thermally degradable polymer (TDP), the TDP may be heated in an anneal process to its decomposition temperature (e.g., 400-500° C.) and, if required, exposed to an ultraviolet (UV) light source, thus, decomposing it into a gaseous state and creating the cavities 109 (see FIG. 17).

Figure 18:
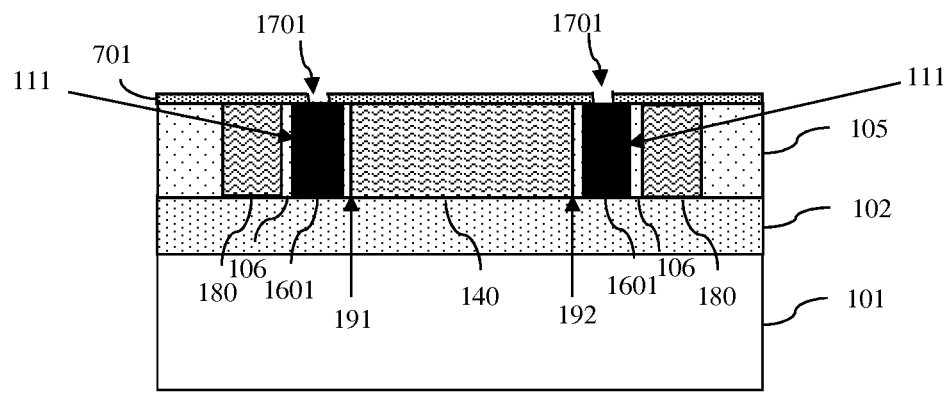
FIG. 18 is cross-section diagram illustrating a partially completed LEDMOSFET formed according to the flow diagram of FIG. 11.

Alternatively, if the degradable material used for the degradable sacrificial layer 1601 comprises a chemically degradable material, such as polysilicon, germanium (Ge) or silicon germanium (SiGe), openings 1701 can be formed through the dielectric cap layer 701 and aligned above the trenches 111 so as to expose a portion of the top surface of the degradable sacrificial layer 1601 (see FIG. 18). These opening 1701 can, for example, be sub-lithographic openings having dimensions of less than 50 nm and preferably of 20 nm or less. Such sub-lithographic openings can be formed, for example, by using a diblock copolymer mask. Then, an etch process can be performed in order to selectively remove the chemically degradable material from the trenches 111, thereby creating the cavities 109 (see FIG. 19). For example, when the degradable sacrificial layer 1601 is germanium (Ge) or silicon germanium (SiGe) layer, a fluorine (F)-based reactive ion etch (RIE) process and, particularly, a tetrafluoromethane ($CF_4$)-based RIE process can be used to remove the layer 1601. However, when the degradable sacrificial layer 1601 is a polysilicon layer, a fluorine (F)-based RIE process and, particularly, a xenon difluoride ($XeF_2$) RIE process or a potassium hydroxide (KOH) wet etch process can be used to remove the layer 1601.

The process(es) 1112 will form the cavities 109 filled with air or gas (i.e., the airgaps or voids) and, thereby will complete the tapered dielectric field plates 107 of FIG. 1.

Figure 19:
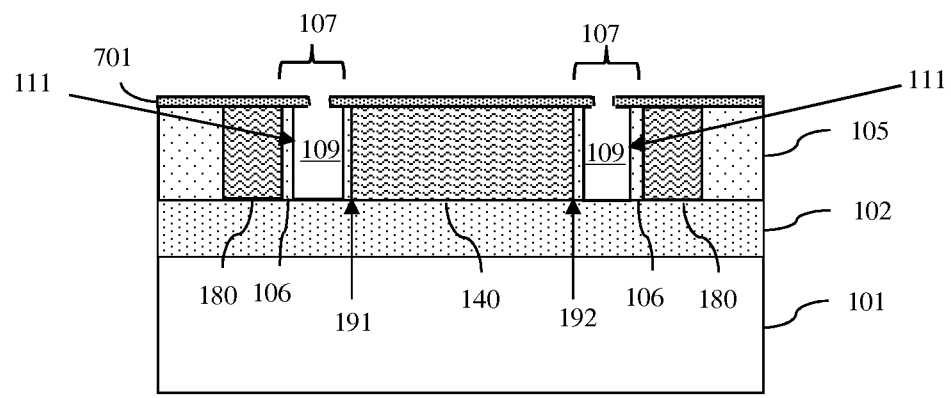
FIG. 19 is cross-section diagram illustrating a partially completed LEDMOSFET 100 formed according to the flow diagram of FIG. 11.

Once the cavities 109 are formed for the LEDMOSFET 100 as illustrated in either FIG. 17 or FIG. 19, additional processing can be performed into order to complete the LEDMOSFET structure 100, as shown in FIG. 1 (1114). This additional processing can include, but is not limited to, formation of the gate structure 170, dopant implantation processes to complete any one or more of the doped regions 110-150 and the conductive field plates 180 (as discussed in detail above with regard to the structure embodiments), silicide formation, interlayer dielectric deposition on the dielectric cap layer 701, contact formation, etc. Those skilled in the art will recognize that the dopant implantation processes used to complete the doped regions 110-150 may be performed at various different times during the LEDMOSFET manufacturing process (E.g., before STI formation, after STI formation, after gate structure formation, etc. Additionally, it should be noted that if openings 1701 and, particularly, sub-lithographic openings are formed in the dielectric cap layer 701 in order to etch out the degradable sacrificial material 1601 (as shown in FIG. 19), chemical vapor deposition of interlayer dielectric materials (e.g., borophosphosilicate glass (BPSG) or silicon dioxide ($SiO_2$)) during subsequent processing 1114 can be used to fill the openings 1701 without destroying the integrity of the cavities 109. Preferably, plasma-enhanced chemical vapor deposition (PECVP) of silicon dioxide (Si02), using a silane N20 chemistry, can be used with only minimal amount of the interlayer dielectric material entering the cavities 109.

In another embodiment of the method, the tapered dielectric field plates 207 and conductive field plates 280, as shown in FIG. 2, can be formed such that each tapered dielectric field plate 207 is positioned laterally between the semiconductor body 204 at the drain drift region 240 and a conductive field plate 180 and has a width 208 that continuously increases along the length 244 of the drain drift region 240 from the channel region 230 to the drain region 250. The tapered dielectric field plates 207 and conductive field plates 280 can further be formed, as shown in FIG. 2, such that each tapered dielectric field plate 207 comprises, in its entirety, a cavity 209 filled with air or gas (i.e., an airgap or void). Furthermore, in yet another embodiment of the method, the tapered dielectric field plates 307 and conductive field plates 380, as shown in FIG. 3, can be formed such that each tapered dielectric field plate 307 is positioned laterally between the semiconductor body 304 at the drain drift region 340 and a conductive field plate 380 and has a width 308 that continuously increases along the length 344 of the drain drift region 340 from the channel region 330 to the drain region 350. The tapered dielectric field plates 307 and conductive field plates 380 can further be formed, as shown in FIG. 3, such that each tapered dielectric field plate 307 comprises a cavity 309 filled with air or gas (i.e., an airgap or void) and that cavity 309 is contained within a trench 311, which is lined with a dielectric liner 306.

Figure 20:
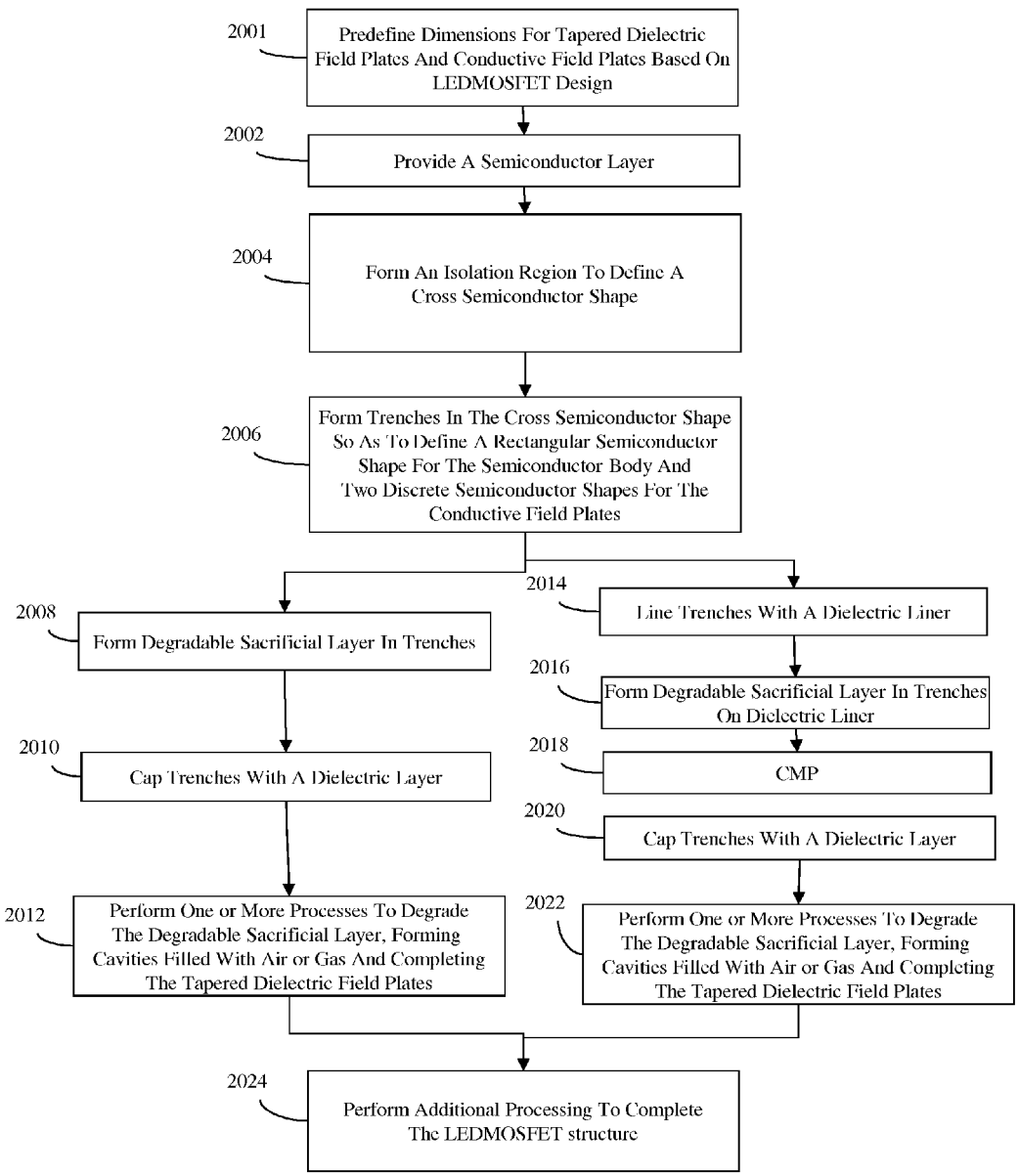
FIG. 20 is a flow diagram illustrating method embodiments for forming the LEDMOSFET of FIG. 2 and the LEDMOSFET of FIG. 3.

FIG. 20 is a flow diagram illustrating techniques that could be used to form both the LEDMOSFET 200 as shown in FIG. 2 and the LEDMOSFET 300 as shown in FIG. 3. Specifically, to form the LEDMOSFET 200 or the LEDMOSFET 300, the dimensions of tapered dielectric field plates and conductive field plates to be incorporated into the LEDMOSFET can be predefined based on the LEDMOSFET design and, particularly, the dimensions of the drain drift region so that the drain drift region has an essentially uniform horizontal electric field profile from the channel region to the drain region and, thereby so that the LEDMOSFET will have a specific drain-to-body breakdown voltage (Vb) (2001).

Figure 21:
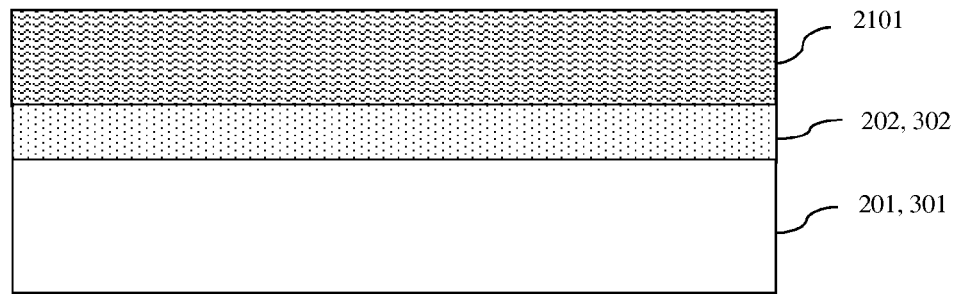
FIG. 21 is a cross-section diagram illustrating a partially completed LEDMOSFET 200 or 300 formed according to the flow diagram of FIG. 20.

Next, to form the LEDMOSFET 200 or the LEDMOSFET 300 a semiconductor layer 2101 can be provided (2002, see FIG. 21). For example, these method embodiments can comprise providing a semiconductor-on-insulator (SOI) wafer (e.g., a silicon-on-insulator wafer). Such an SOI wafer can comprise a semiconductor substrate 201, 301 (e.g., a silicon substrate or other semiconductor substrate), an insulator layer 202, 302 (e.g., a silicon dioxide ($SiO_2$) layer or other suitable insulator layer) on the substrate 201, 301 and a semiconductor layer 1901 (e.g., a single crystalline silicon layer, a single crystalline gallium nitride layer or other suitable semiconductor layer) on the insulator layer 202, 302. Alternatively, the semiconductor layer 1901 can comprise a bulk semiconductor wafer (e.g., a single crystalline silicon wafer) (not shown).

Figure 22:
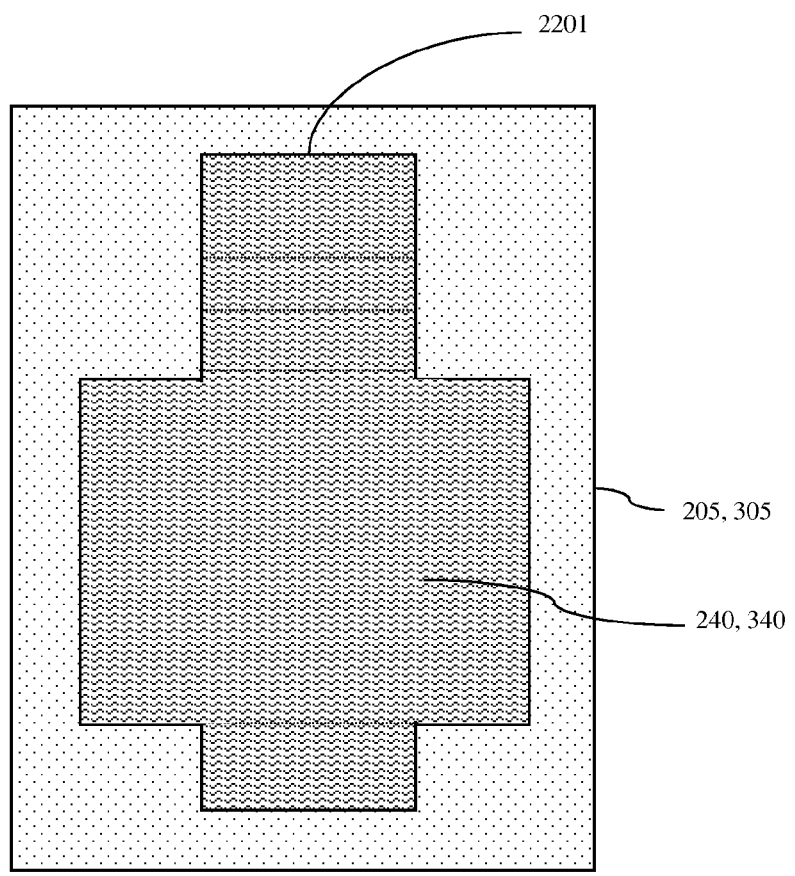
FIG. 22 is a top view diagram illustrating a partially completed LEDMOSFET 200 or 300 formed according to the flow diagram of FIG. 20.

Then, an isolation region 205, 305 can be formed as to define a cross shape 2201 in the semiconductor layer (2004, see FIG. 22). This cross shape 2201 can comprise a first rectangular shape and a second rectangular shape traversing the first rectangular shape in an area corresponding to what will be the drain drift region 240, 340 of the LEDMOSFET 200, 300. Such an isolation region 205, 305 can be formed, for example, using conventional shallow trench isolation (STI) techniques. That is, a trench can be lithographically patterned and etched such that it defines the cross shape 2201 in the semiconductor layer and further such that it extends vertically through the semiconductor layer to the insulator layer below. This trench can then be filled with one or more isolation materials (e.g., a silicon dioxide ($SiO_2$), silicon nitride (SiN), silicon oxynitride (SiON), etc.).

Figure 23:
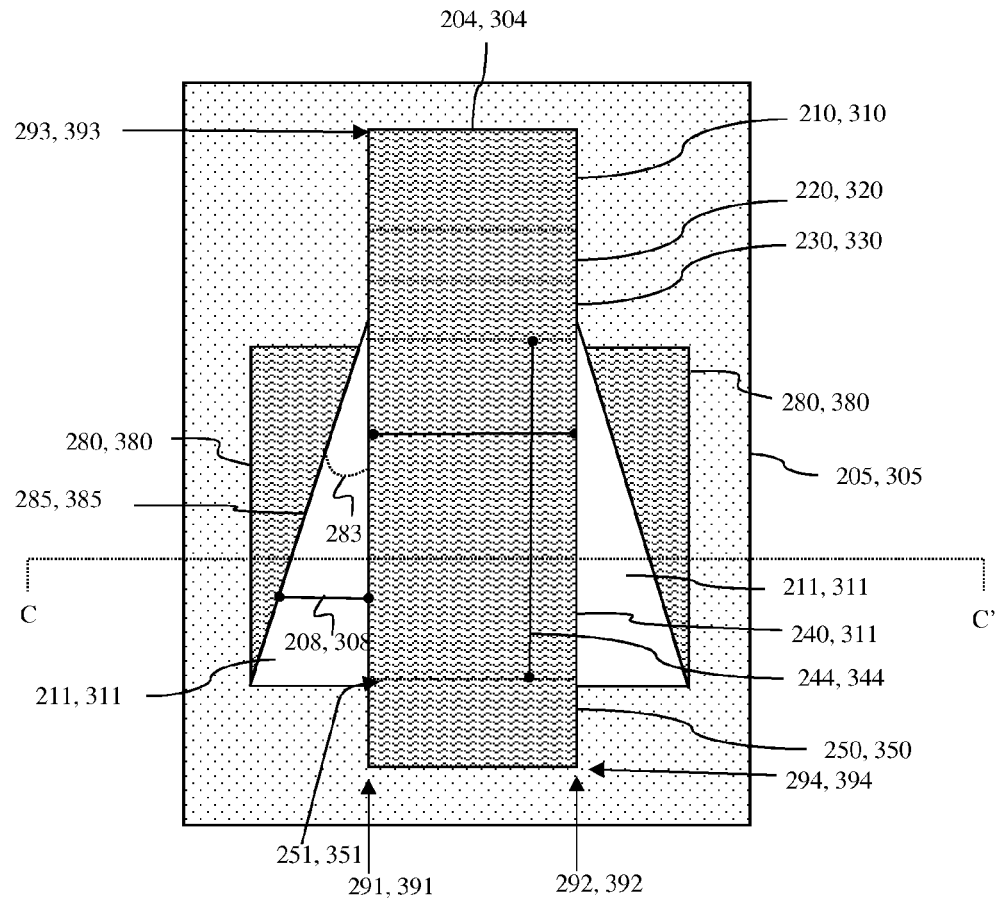
FIG. 23 is a top view diagram illustrating a partially completed LEDMOSFET 200 or 300 formed according to the flow diagram of FIG. 20.
Figure 24:
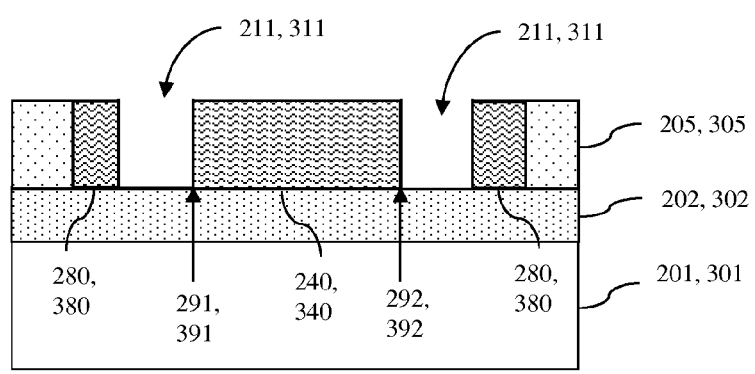
FIG. 24 is cross-section diagram illustrating a partially completed LEDMOSFET 200 or 300 formed according to the flow diagram of FIG. 20.

Once the isolation region 205, 305 is formed, additional trenches 211, 311 can be formed (e.g., using conventional lithographic patterning and etch techniques) in the cross semiconductor shape 2201 so as to define a rectangular semiconductor shape for the semiconductor body 204, 304 having the various regions (e.g., source region 210, 310 at a first end 293, 393; a halo region 220, 320 adjacent to the source region 210, 310; a channel region 230, 330 adjacent to the halo region 220, 320; a drain drift region 240, 340 adjacent to the channel region 230, 330; and a drain region 250, 350 at the second end 294, 394), as discussed in detail above (2006, see FIGS. 23-24). These trenches 211, 311 can be formed at process 2006 so as to define two discrete semiconductor shapes for the conductive field plates 280, 380 on the opposing sides 291-292, 391-392 of the semiconductor body 204, 304 such that the conductive field plates 280, 380 are separated from the opposing sides 291-292, 391-392 of the semiconductor body 204, 304. The trenches 211, 311 can be formed so as to have an essentially triangular shape and, thereby such that the conductive field plates 280, 280 are angled (see angle 283, 383) relative to the semiconductor body 204, 304 and such that the width 208, 308 of each of the resulting dielectric field plates will increase linearly along the length 244, 344 of the drain drift region 240, 340 from the channel region 230, 330 to the drain region 250, 350. For illustration purposes, each trench 211, 311 is shown as being essentially triangular in shape with three clearly defined vertices (i.e., corners). However, it should be understood that in practice, due to the method steps used to form each trench 211, 311, the vertices may in fact be curved or rounded.

Process steps 2008-2012 of FIG. 20 are directed to the method embodiment for forming the LEDMOSFET 200 of FIG. 2 specifically. To form the LEDMOSFET 200, a degradable sacrificial layer 2501 can be formed in the trenches 211 (2008, see FIG. 25). This degradable sacrificial layer 2501 can comprise a degradable (i.e., decomposable) material, such as a thermally degradable material or a chemically degradable material. For example, this degradable sacrificial layer 2501 can comprise a thermally degradable polymer material or any other suitable thermally degradable material that will decompose into a gaseous state when the temperature of the material is raised above a decomposition temperature and/or when the material is exposed to ultra-violet (UV) radiation. Alternatively, this degradable sacrificial layer 2501 can comprise a chemically degradable material and, particularly, a material that can be selectively etched over at least the semiconductor material of the drain drift region 240 and conductive field plates 280 which bound two sides of the trenches 211. For example, if the drain drift region 240 and conductive field plates 28 comprise silicon, then the chemically degradable material can comprise, for example, germanium (Ge), silicon germanium (SiGe) or silicon dioxide ($SiO_2$).

Figure 25:
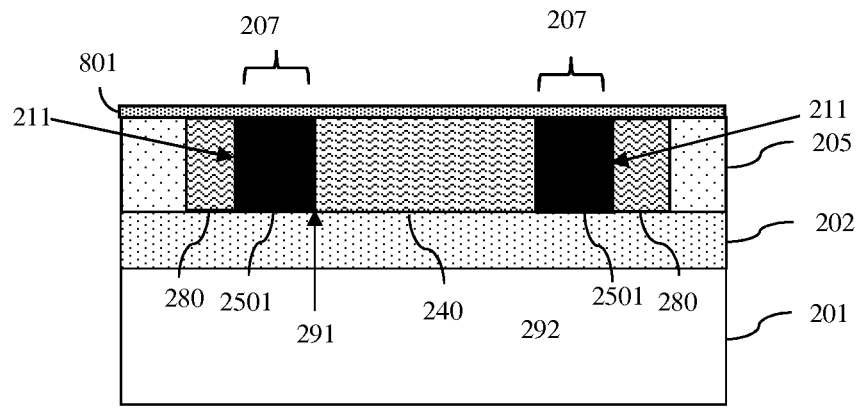
FIG. 25 is cross-section diagram illustrating a partially completed LEDMOSFET 200 formed according to the flow diagram of FIG. 20.

Then, a dielectric cap layer 801 can be formed (e.g., deposited) so as to each of the trenches 211 (e.g., to cover the degradable sacrificial layer 2501 contained within the trenches 211) (2010, see FIG. 25). The dielectric cap layer 801 can comprise, for example, a silicon dioxide ($SiO_2$) layer, a silicon nitride (SiN) layer, silicon oxynitride (SiON) layer, or any other suitable dielectric cap layer. It should be understood that in the case where the degradable sacrificial layer 2301 is a chemically degradable sacrificial layer, the dielectric cap layer 801 should be preselected so that the chemically degradable sacrificial layer can be selectively etched over the dielectric cap layer 801. For example, if the chemically degradable material comprises germanium (Ge), silicon germanium (SiGe) or silicon dioxide ($SiO_2$), the dielectric cap layer 801 can comprise a silicon nitride (SiN) or silicon oxynitride (SiON) layer.

Next, one or more suitable processes can be performed in order to degrade the degradable sacrificial layer 2301 within the trenches 211 and, thereby form the cavities 209 (2012).

Figure 26:
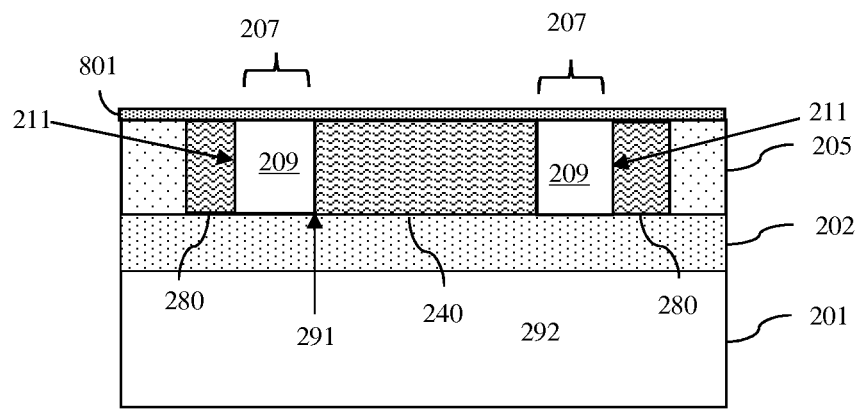
FIG. 26 is cross-section diagram illustrating a partially completed LEDMOSFET 200 formed according to the flow diagram of FIG. 20.

For example, if the degradable material used for the degradable sacrificial layer 2501 comprises a thermally degradable polymer (TDP), the TDP may be heated in an anneal process to its decomposition temperature (e.g., 400-500° C.) and, if required, exposed to an ultraviolent (UV) light source, thus, decomposing it into a gaseous state and creating the cavity 209 (see FIG. 26).

Figure 27:
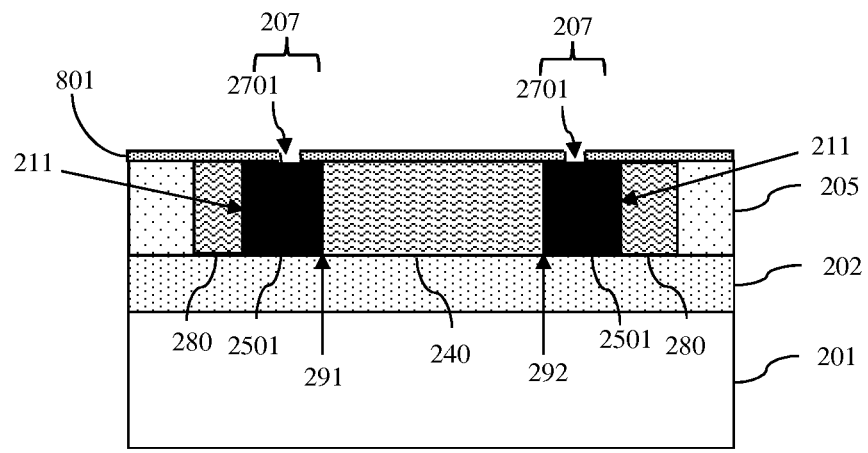
FIG. 27 is cross-section diagram illustrating a partially completed LEDMOSFET 200 formed according to the flow diagram of FIG. 20.

Alternatively, if the degradable material used for the degradable sacrificial layer 2501 comprises a chemically degradable material, such as germanium (Ge), silicon germanium (SiGe) or silicon dioxide ($SiO_2$), openings 2701 can be formed through the dielectric cap layer 801 and aligned above the trenches 211 so as to expose a portion of the top surface of the degradable sacrificial layer 2501 (see FIG. 27). These opening 2701 can, for example, be sub-lithographic openings having dimensions of less than 50 nm and preferably of 20 nm or less. Such sub-lithographic openings can be formed, for example, by using a diblock copolymer mask. Then, an etch process can be performed in order to selectively remove the chemically degradable material from the trenches 211, thereby creating the cavities 209 (see FIG. 28). For example, when the degradable sacrificial layer 2501 is germanium (Ge) or silicon germanium (SiGe) layer, a fluorine (F)-based reactive ion etch (RIE) process and, particularly, a tetrafluoromethane ($CF_4$)-based RIE process can be used to remove the layer 2501. However, when the degradable sacrificial layer 2501 is silicon dioxide ($SiO_2$), a hydrofluoric (HF) acid vapor etch process or a buffered hydrofluoric (HF) acid wet etch process can be used to remove the layer 2501. Although not shown, those skilled in the art will recognize etching of the silicon dioxide ($SiO_2$) trench fill material using a hydrofluoric (HF) acid vapor etch or a buffered hydrofluoric (HF) acid wet etch may result in etching, at least to some degree, of the isolation layer 202, below the trenches 211, when that isolation layer 202 also comprises silicon dioxide ($SiO_2$). The process(es) 2012 will form the cavities 209 filled with air or gas (i.e., the airgaps or voids) and, thereby will complete the tapered dielectric field plates 207 of FIG. 2.

Figure 28:
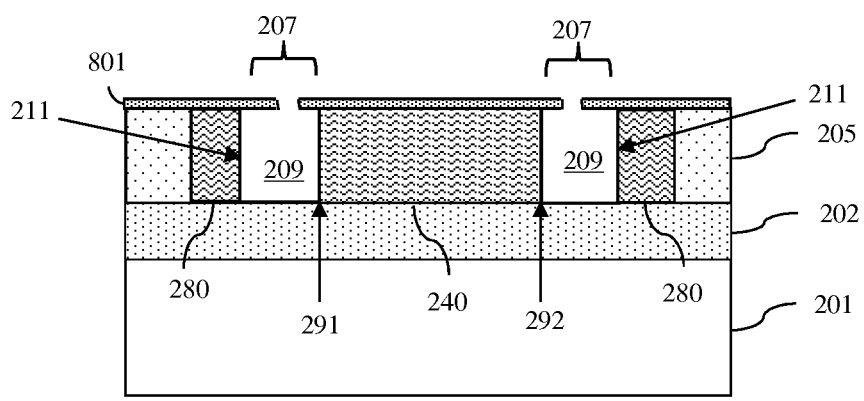
FIG. 28 is cross-section diagram illustrating a partially completed LEDMOSFET 200 formed according to the flow diagram of FIG. 20.

Once the cavities 209 for the LEDMOFET 200 are formed, additional processing can be performed into order to complete the LEDMOSFET structure 200 (2024). This additional processing can include, but is not limited to, formation of the gate structure 270, dopant implantation processes to complete any of the doped regions 210-250 and the conductive field plates 280 (as discussed in detail above with regard to the structure embodiments), silicide formation, interlayer dielectric deposition on the dielectric cap layer 801, contact formation, etc. Those skilled in the art will recognize that the dopant implantation processes used to complete the doped regions 210-250 may be performed at various different times during the LEDMOSFET manufacturing process (E.g., before STI formation, after STI formation, after gate structure formation, etc.). Additionally, it should be noted that if openings 2701 and, particularly, sub-lithographic openings are formed in the dielectric cap layer 801 in order to etch out the degradable sacrificial material 2501 (as shown in FIG. 28), chemical vapor deposition of interlayer dielectric materials (e.g., borophosphosilicate glass (BPSG) or silicon dioxide ($SiO_2$)) during subsequent processing 2024 can be used to fill the openings 2701 without destroying the integrity of the cavities 209. Preferably, plasma-enhanced chemical vapor deposition (PECVP) of silicon dioxide (SiO2), using a silane N20 chemistry, can be used with only minimal amount of the interlayer dielectric material entering the cavities 209.

Figure 29:
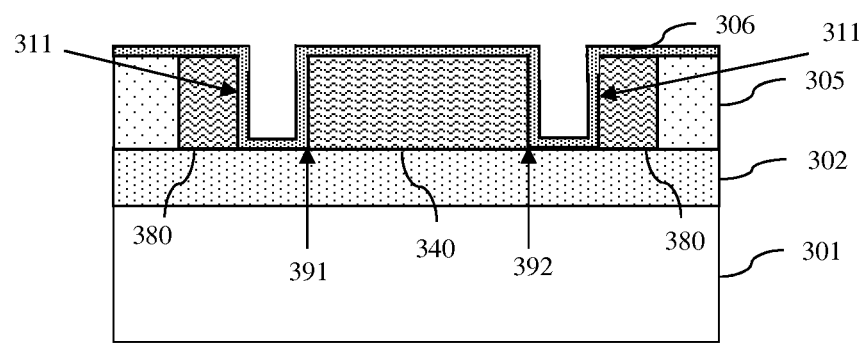
FIG. 29 is cross-section diagram illustrating a partially completed LEDMOSFET 300 formed according to the flow diagram of FIG. 20.
Figure 30:
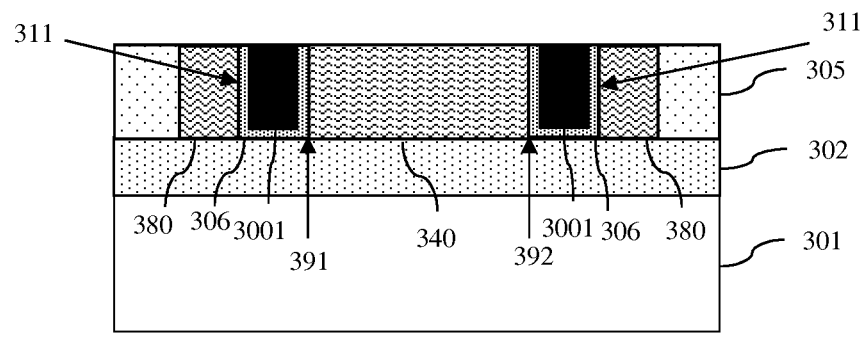
FIG. 30 is cross-section diagram illustrating a partially completed LEDMOSFET 300 formed according to the flow diagram of FIG. 20.

Process steps 2014-2022 of FIG. 20 are directed to the method embodiment for forming the LEDMOSFET 300 of FIG. 3 specifically. The method embodiment for forming the LEDMOSFET 300 of FIG. 3 is similar to that described above for forming the LEDMOSFET 200 of FIG. 2 except that the trenches 311 in the LEDMOSFET 300 are lined with a dielectric liner 306. That is, the method embodiment for forming the LEDMOSFET 300 of FIG. 3 can comprise, after forming the trenches 311 as shown in FIG. 24, forming (e.g., depositing) a dielectric liner 306 so as to line the trenches 311 (2014, see FIG. 29), forming (e.g., depositing) a blanket degradable sacrificial layer 3001 on the dielectric liner 306 (2016) and performing a chemical mechanical polishing (CMP) process to remove the dielectric liner material and degradable sacrificial layer material from the top surface of the structure (2018, see FIG. 30). The dielectric liner 306 can comprise, for example, a silicon dioxide ($SiO_2$) liner, a silicon nitride (SiN) liner, silicon oxynitride (SiON) liner, etc. The degradable sacrificial layer 3001 can comprise a degradable (i.e., decomposable) material, such as a thermally degradable material or a chemically degradable material. For example, this degradable sacrificial layer 3001 can comprise a thermally degradable polymer material or any other suitable thermally degradable material that will decompose into a gaseous state when the temperature of the material is raised above a decomposition temperature and/or when the material is exposed to ultraviolet (UV) radiation. Alternatively, this degradable sacrificial layer 3001 can comprise a chemically degradable material and, particularly, a material that can be selectively etched over at least the dielectric liner 306 which bounds the trenches 311 laterally and below. For example, if the dielectric liner 306 comprises a silicon nitride (SiN) liner, then the chemically degradable material can comprise, for example, germanium (Ge), silicon germanium (SiGe), polysilicon or silicon dioxide ($SiO_2$).

Figure 31:
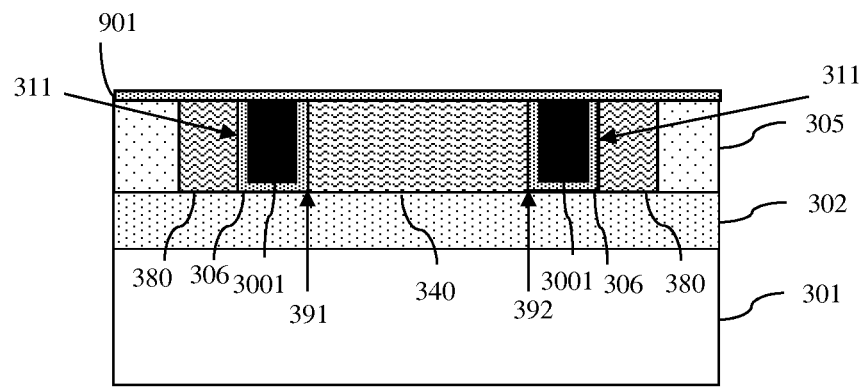
FIG. 31 is cross-section diagram illustrating a partially completed LEDMOSFET 300 formed according to the flow diagram of FIG. 20.

Then, a dielectric cap layer 901 can be formed (e.g., deposited) so as to cover each of the trenches 311 (e.g., to cover the degradable sacrificial layer 3001 contained within the trenches 311) (2020, see FIG. 31). The dielectric cap layer 901 can comprise, for example, a silicon dioxide ($SiO_2$) layer, a silicon nitride (SiN) layer, silicon oxynitride (SiON) layer, or any other suitable dielectric cap layer. It should be understood that in the case where the degradable sacrificial layer 3001 is a chemically degradable sacrificial layer, the dielectric cap layer 901 should be preselected so that the chemically degradable sacrificial layer can be selectively etched over the dielectric cap layer 901. For example, if the chemically degradable material comprises germanium (Ge), silicon germanium (SiGe), polysilicon or silicon dioxide ($SiO_2$), the dielectric cap layer 901 can comprise a silicon nitride (SiN) or silicon oxynitride (SiON) layer.

Next, one or more suitable processes can be performed in order to degrade the degradable sacrificial layer 3001 within the dielectric-lined trenches 311 and, thereby form the cavities 309 (2022).

Figure 32:
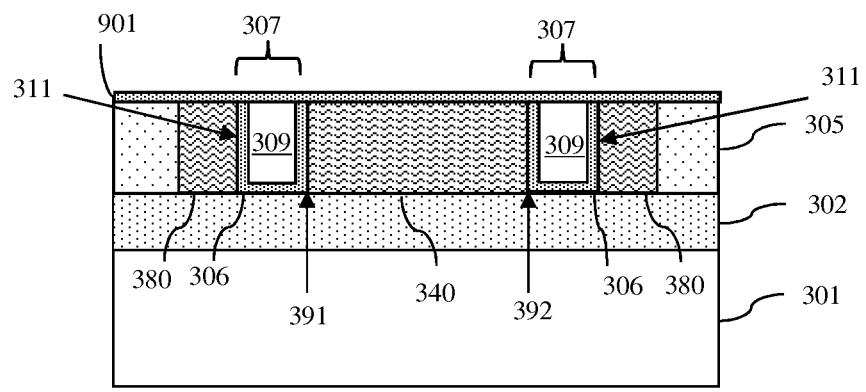
FIG. 32 is cross-section diagram illustrating a partially completed LEDMOSFET 300 formed according to the flow diagram of FIG. 20.

For example, if the degradable material used for the degradable sacrificial layer 3001 comprises a thermally degradable polymer (TDP), the TDP may be heated in an anneal process to its decomposition temperature (e.g., 400-500° C.) and, if required, exposed to an ultraviolet (UV) light source, thus, decomposing it into a gaseous state and creating the cavity 309 (see FIG. 32).

Figure 33:
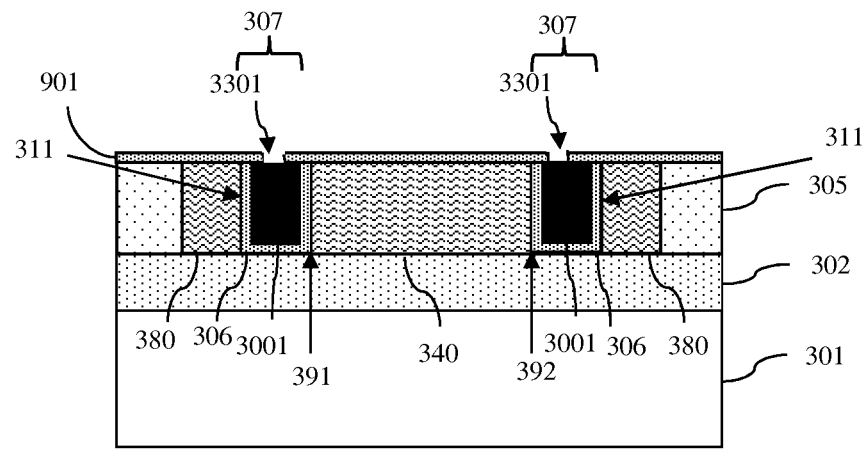
FIG. 33 is cross-section diagram illustrating a partially completed LEDMOSFET 300 formed according to the flow diagram of FIG. 20.

Alternatively, if the degradable material used for the degradable sacrificial layer 3001 comprises a chemically degradable material, such as germanium (Ge), silicon germanium (SiGe), polysilicon or silicon dioxide ($SiO_2$), openings 3301 can be formed through the dielectric cap layer 901 and aligned above the dielectric-lined trenches 311 so as to expose a portion of the top surface of the degradable sacrificial layer 3001 (see FIG. 33). These opening 3301 can, for example, be sub-lithographic openings having dimensions of less than 50 nm and preferably of 20 nm or less. Such sub-lithographic openings can be formed, for example, by using a diblock copolymer mask. Then, an etch process can be performed in order to selectively remove the chemically degradable material from the dielectric-lined trenches 311, thereby creating the cavities 309 (see FIG. 34). For example, when the degradable sacrificial layer 3001 is germanium (Ge) or silicon germanium (SiGe) layer, a fluorine (F)-based reactive ion etch (RIE) process and, particularly, a tetrafluoromethane ($CF_4$)-based RIE process can be used to remove the layer 3001. When the degradable sacrificial layer 3001 is a polysilicon layer, a fluorine (F)-based RIE process and, particularly, a xenon difluoride ($XeF_2$) RIE process or a potassium hydroxide (KOH) wet etch process can be used to remove the layer 2601. Finally, when the degradable sacrificial layer 3001 is silicon dioxide ($SiO_2$), a hydrofluoric (HF) acid vapor etch process or a buffered hydrofluoric (HF) acid wet etch process can be used to remove the layer 3001.

Figure 34:
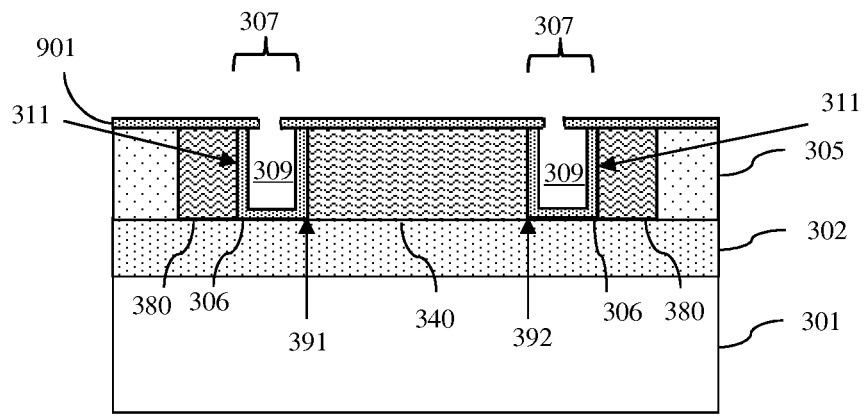
FIG. 34 is cross-section diagram illustrating a partially completed LEDMOSFET 300 formed according to the flow diagram of FIG. 20.

Once the cavities 309 for the LEDMOFET 300 are formed, the same additional processing, as discussed above with regard to forming the LEDMOSFET 200, can be performed into order to complete the LEDMOSFET structure 300 (2024). This additional processing can include, but is not limited to, formation of the gate structure 370, dopant implantation processes to complete any of the doped regions 310-350 and the conductive field plates 380 (as discussed in detail above with regard to the structure embodiments), silicide formation, interlayer dielectric deposition on the dielectric cap layer 901, contact formation, etc. Those skilled in the art will recognize that the dopant implantation processes used to complete the doped regions 310-350 may be performed at various different times during the LEDMOSFET manufacturing process (E.g., before STI formation, after STI formation, after gate structure formation, etc.). Additionally, it should be noted that if openings 3301 and, particularly, sub-lithographic openings are formed in the dielectric cap layer 901 in order to etch out the degradable sacrificial material 3001 (as shown in FIG. 34), chemical vapor deposition of interlayer dielectric materials (e.g., borophosphosilicate glass (BPSG) or silicon dioxide ($SiO_2$)) during subsequent processing 2024 can be used to fill the openings 3301 without destroying the integrity of the cavities 309. Preferably, plasma-enhanced chemical vapor deposition (PECVP) of silicon dioxide (Si02), using a silane N20 chemistry, can be used with only minimal amount of the interlayer dielectric material entering the cavities 209.

It should be noted that, while the techniques described above for forming the LEDMOSFETs 100, 200 and 300 result in an LEDMOSFET structure having conductive field plates that comprise discrete semiconductor shapes, those skilled in the art will recognize that any of these techniques could be modified so as to result in LEDMOSFETs comprising discrete metal shapes or an extension of a gate structure that traverses the channel region, for example, as disclosed in U.S. Patent Application Publication No. 20120168766 and U.S. Patent Application Publication No. 20120168817, incorporated by reference above).

Furthermore, it should be noted that in the structure and method embodiments described above the "first conductivity type" and "second conductivity type" will vary depending upon whether described LEDMOSFET is a n-type MOSFET (NFET) or p-type MOSFET (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. Those skilled in the art will recognize that the different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si). Finally, it should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a lateral, extended drain, metal oxide semiconductor, field effect transistor (LEDMOSFET) having tapered dielectric field plates positioned laterally between conductive field plates and opposing sides of a drain drift region of the LEDMOSFET. Each tapered dielectric field plate comprises, in whole or in part, a cavity filled with air or gas (i.e., an airgap or void). The conductive and dielectric field plates, as described above, form plate capacitors that can create an essentially uniform horizontal electric field profile within the drain drift region so that the LEDMOSFET can exhibit a specific, relatively high, breakdown voltage (Vb). Tapered dielectric field plates that incorporate airgaps provide for better control over the creation of the uniform horizontal electric field profile within the drain drift region, as compared to tapered dielectric field plates without such airgaps and, thereby ensure that the LEDMOSFET exhibits the specific, relatively high, breakdown voltage (Vb) desired. Also disclosed herein are embodiments of a method of forming such an LEDMOSFET.

What is claimed is:
1. A field effect transistor comprising:
an insulator layer;
a semiconductor body on said insulator layer, said semiconductor body being essentially rectangular in shape and having a bottom surface immediately adjacent to said insulator layer, a top surface opposite said bottom surface, opposing sidewalls, a first end and a second end opposite said first end, and said semiconductor body comprising:
a source region within said semiconductor body at said first end;
a drain region within said semiconductor body at said second end;
a channel region within said semiconductor body positioned laterally adjacent to said source region; and
a drain drift region within said semiconductor body extending laterally from said channel region to said drain region;
dielectric field plates on said insulator layer positioned laterally immediately adjacent to said opposing sidewalls, respectively, such that said drain drift region is positioned between and immediately adjacent to said dielectric field plates;
conductive field plates on said insulator layer positioned laterally immediately adjacent to said dielectric field plates such that each dielectric field plate is between said drain drift region and a conductive field plate,
said dielectric field plate having a width that increases along a length of said drain drift region from said channel region to said drain region such that a dis- tance between said drain drift region and said conductive field plate increases along said length of said drain drift region,
said dielectric field plate comprising a cavity filled with any one of air and gas,
said cavity having an essentially triangular shaped cross-section through a plane that is parallel to said top surface of said semiconductor body, and
said conductive field plate being longer than said cavity and extending laterally beyond said cavity toward said drain region; and,
a dielectric cap layer above and immediately adjacent to top surfaces of said conductive field plates and said semiconductor body, said dielectric cap layer further extending laterally over and covering said cavity.

2. The field effect transistor of claim 1, said cavity extending vertically to at least a top surface of said insulator layer and further having an essentially triangular shape defined by vertical surfaces of said semiconductor body at said drain drift region, of said conductive field plate and of an isolation region.

3. The field effect transistor of claim 2, wherein, within said cavity, said top surface of said insulator layer and said vertical surfaces of said semiconductor body, said conductive field plate and said isolation region are lined with a dielectric liner.

4. The field effect transistor of claim 1, said dielectric field plate further comprising isolation material, said cavity being within said isolation material such that said isolation material that physically separates said cavity from said conductive field plate and said drain drift region.

5. The field effect transistor of claim 1, said top surfaces of said conductive field plates and said semiconductor body being essentially co-planar.

6. The field effect transistor of claim 1, said drain drift region having an essentially uniform horizontal electric field profile from said channel region to said drain region and said dielectric field plates having predefined dimensions so that said field effect transistor has a specific drain-to-body breakdown voltage.

7. The field effect transistor of claim 1, each conductive field plate comprising one of a discrete semiconductor shape, a discrete metal shape, and an extension of a gate structure traversing said channel region.

8. A field effect transistor comprising:
an insulator layer;
a semiconductor body on said insulator layer, said semiconductor body being essentially rectangular in shape and having a bottom surface immediately adjacent to said insulator layer, a top surface opposite said bottom surface, opposing sidewalls, a first end and a second end opposite said first end, and said semiconductor body comprising:
a source region within said semiconductor body at said first end;
a drain region within said semiconductor body at said second end;
a channel region within said semiconductor body on said insulator layer and positioned laterally adjacent to said source region; and
a drain drift region within said semiconductor body extending laterally from said channel region to said drain region;
an isolation region on said insulator layer and positioned laterally immediately adjacent to said opposing sidewalls, said first end and said second end of said semiconductor body, said isolation region comprising isolation material;
conductive field plates extending through said isolation region to said insulator layer such that portions of said isolation region are positioned between said conductive field plates and said opposing sidewalls of said semiconductor body, respectively, such that said drain drift region is positioned between and immediately adjacent to said portions of said isolation region,
each portion of said isolation region that is positioned between a corresponding one of said conductive field plates and an opposing sidewall of said semiconductor body forming a dielectric field plate,
said dielectric field plate having a width that increases along a length of said drain drift region from said channel region to said drain region such that a distance between said drain drift region and said corresponding one of said conductive field plates increases along said length of said drain drift region,
said dielectric field plate having a cavity that extends through said isolation region to said insulator layer and that is physically separated from said corresponding one of said conductive field plates and said opposing sidewall of said semiconductor body by said isolation material,
said cavity having a triangular shaped cross-section through a plane that is parallel to said top surface of said semiconductor body,
said corresponding one of said conductive field plates being longer than said cavity and extending laterally beyond said cavity toward said drain region; and,
a dielectric cap layer above and immediately adjacent to top surfaces of said conductive field plates, said semiconductor body, and said isolation region, said dielectric cap layer further extending laterally over and covering said cavity.

9. The field effect transistor of claim 8, said top surfaces of said conductive field plates, said semiconductor body, and said isolation region being essentially co-planar.

10. The field effect transistor of claim 8, said cavity being centered within said portion of said isolation region.

11. The field effect transistor of claim 10, said cavity having a smaller triangular shape than said portion of said isolation region.

12. The field effect transistor of claim 8, said drain drift region having an essentially uniform horizontal electric field profile from said channel region to said drain region and said dielectric field plate having predefined dimensions so that said field effect transistor has a specific drain-to-body breakdown voltage.

13. The field effect transistor of claim 8, each conductive field plate comprising one of a discrete semiconductor shape, a discrete metal shape, and an extension of a gate structure traversing said channel region.

14. A field effect transistor comprising:
an insulator layer
a silicon body on said insulator layer, said silicon body having an essentially rectangular shape and having a bottom surface, a top surface opposite said bottom surface, opposing sidewalls, a first end and a second end opposite said first end, and said silicon body comprising:
a source region within said silicon body at said first end;
a drain region within said silicon body at said second end;
a channel region within said silicon body positioned laterally adjacent to said source region; and
a drain drift region within said silicon body extending laterally from said channel region to said drain region;

dielectric field plates on said insulator layer positioned laterally immediately adjacent to said opposing sidewalls, respectively, such that said drain drift region is positioned between and immediately adjacent to said dielectric field plates;

conductive field plates on said insulator layer positioned laterally immediately adjacent to said dielectric field plates such that each dielectric field plate is between said drain drift region and a conductive field plate, said dielectric field plate having a width that increases along a length of said drain drift region from said channel region to said drain region such that a distance between said drain drift region and said conductive field plate increases along said length of said drain drift region, said dielectric field plate comprising a cavity filled with any one of air and gas, said cavity having a triangular shaped cross-section through a plane that is parallel to said top surface of said silicon body, and said conductive field plate being longer than said cavity and extending laterally beyond said cavity toward said drain region; and, a dielectric cap layer above and immediately adjacent to top surfaces of said conductive field plates and said silicon body, said dielectric cap layer further extending laterally over and covering said cavity.

15. The field effect transistor of claim 14, said dielectric field plate further comprising isolation material, said cavity being within said isolation material such that said isolation material physically separates said cavity from said conductive field plate and said drain drift region.

16. The field effect transistor of claim 14, said top surfaces of said conductive field plates and said silicon body being essentially co-planar.

17. The field effect transistor of claim 14, said drain drift region having an essentially uniform horizontal electric field profile from said channel region to said drain region and said dielectric field plates having predefined dimensions so that said field effect transistor has a specific drain-to-body breakdown voltage.

18. The field effect transistor of claim 14, each conductive field plate comprising one of a discrete semiconductor shape, a discrete metal shape, and an extension of a gate structure traversing said channel region.

19. A field effect transistor comprising:
an insulator layer;
a silicon body on said insulator layer, said silicon body being essentially rectangular in shape and having a bottom surface immediately adjacent to said insulator layer, a top surface opposite said bottom surface, opposing sidewalls, a first end and a second end opposite said first end, and said silicon body comprising:
a source region within said silicon body at said first end;
a drain region within said silicon body at said second end;
a channel region within said silicon body positioned laterally adjacent to said source region; and
a drain drift region within said silicon body extending laterally from said channel region to said drain region;

an isolation region on said insulator layer and positioned laterally immediately adjacent to said opposing sidewalls, said first end and said second end of said silicon body, said isolation region comprising isolation material;

conductive field plates extending through said isolation region and to said insulator layer such that portions of said isolation region are positioned between said conductive field plates and said opposing sidewalls of said silicon body, respectively, and such that said drain drift region is positioned between and immediately adjacent to said portions of said isolation region, each portion of said isolation region that is positioned between a corresponding one of said conductive field plates and an opposing sidewall of said silicon body forming a dielectric field plate, said dielectric field plate having a width that increases along a length of said drain drift region from said channel region to said drain region such that a distance between said drain drift region and said corresponding one of said conductive field plates increases along said length of said drain drift region, said dielectric field plate having a cavity that extends through said portion of said isolation region to said insulator layer and that is physically separated from said corresponding one of said conductive field plates and said opposing sidewall of said silicon body by said isolation material, said cavity having a triangular shaped cross-section through a plane that is parallel to said top surface of said silicon body, said corresponding one of said conductive field plates being longer than said cavity and extending laterally beyond said cavity toward said drain region; and, a dielectric cap layer above and immediately adjacent to top surfaces of said conductive field plates, said silicon body, and said isolation region, said dielectric cap layer further extending laterally over and covering said cavity.

20. The field effect transistor of claim 19, said top surfaces of said conductive field plates, said silicon body and said isolation region being essentially co-planar.

21. The field effect transistor of claim 19, said cavity being centered with said portion of said isolation region.

22. The field effect transistor of claim 21, said cavity having a smaller triangular shape than said portion of said isolation region.

23. The field effect transistor of claim 19, said drain drift region having an essentially uniform horizontal electric field profile from said channel region to said drain region and said dielectric field plate having predefined dimensions so that said field effect transistor has a specific drain-to-body breakdown voltage.

24. The field effect transistor of claim 19, each conductive field plate comprising one of a discrete semiconductor shape, a discrete metal shape, and an extension of a gate structure traversing said channel region.

* * * * *